United States Patent [19]

Tanaka et al.

[11] Patent Number: 5,733,712
[45] Date of Patent: Mar. 31, 1998

[54] RESIST PATTERN FORMING METHOD USING ANTI-REFLECTIVE LAYER, RESIST PATTERN FORMED, AND METHOD OF ETCHING USING RESIST PATTERN AND PRODUCT FORMED

[75] Inventors: Toshihiko Tanaka, Tokyo; Shoichi Uchino, Hachioji; Naoko Asai, Kokubunji, all of Japan

[73] Assignee: Hitachi, Ltd., Tokyo, Japan

[21] Appl. No.: 601,361

[22] Filed: Feb. 16, 1996

[30] Foreign Application Priority Data

Feb. 20, 1995 [JP] Japan ................ 7-030425
Feb. 22, 1995 [JP] Japan ................ 7-033313
May 22, 1995 [JP] Japan ................ 7-122150

[51] Int. Cl.$^6$ ........................................ G03C 1/825
[52] U.S. Cl. ............ 430/314; 430/157; 430/162; 430/271.1; 430/272.1; 430/275.1; 430/311; 430/313; 430/318; 430/325; 430/326; 430/327; 430/329; 430/330; 430/510; 430/512; 430/523; 430/524; 430/525; 430/526; 430/950
[58] Field of Search ........................ 430/325, 326, 430/272.1, 275.1, 510, 512, 523, 524, 525, 526, 950, 157, 162, 271.1, 311, 313, 314, 318, 327, 329, 330

[56] References Cited

U.S. PATENT DOCUMENTS 5,472,829  12/1995  Ogawa ........................ 430/510
5,591,566  1/1997  Ogawa ........................ 430/510

*Primary Examiner*—Christopher G. Young
*Attorney, Agent, or Firm*—Antonelli, Terry, Stout, & Kraus, LLP

[57] ABSTRACT

A first method forms between the substrate and resist film an anti-reflective film whose photoabsorbance of the exposure light is greater on the substrate surface side than on the resist surface side. A second method forms between the substrate and resist film a two-layer anti-reflective film made up of an upper-layer film which is an interference film for the exposure light and a lower-layer film which has higher exposure light absorbance than the upper-layer film and functions as a light shielding film. A third method forms between the substrate and resist film a two-layer anti-reflective film consisting of a lower-layer film that reflects the exposure light and an upper-layer film that is an interference film for the exposure light. A very high anti-reflection effect can be obtained without aspect ratio problems during the process of forming the anti-reflective film and without being influenced by the kind of substrate including those having a transparent film. With these methods, it is possible to form a fine and highly precise resist pattern. These methods can be used to form patterned resist films to etch object films, e.g., in forming microcircuits and/or gates (and word lines) of semiconductor devices.

109 Claims, 22 Drawing Sheets

RESIST PATTERN FORMING METHOD USING ANTI-REFLECTIVE LAYER, RESIST PATTERN FORMED, AND METHOD OF ETCHING USING RESIST PATTERN AND PRODUCT FORMED

BACKGROUND OF THE INVENTION

The present invention relates to a method of forming a resist pattern by lithography and an anti-reflective layer used in forming the resist pattern.

An anti-reflection technology, to suppress reflection of exposure light from a substrate, has been known as a peripheral technology of lithography that meets the necessary conditions of dimensional precision and resolution required of ULSI manufacture. When exposure light is reflected from the substrate, a thin-film interference occurs in a resist film, producing exposure variations in the direction of resist film thickness, called standing waves, and pattern dimension variations called multiple interferences caused by resist film thickness variations. The former degrades the resolution, while the latter deteriorates the dimensional precision. Halation, which is caused by exposure light being reflected on uneven surfaces of the substrate in diagonal directions and in random directions, poses a problem that areas that are originally intended to be shielded from exposure are exposed, making it impossible to form a desired pattern. These problems depend on the intensity of the reflected light from the substrate. The more the reflected light is reduced, the more these problems are mitigated. For this reason, growing efforts are being focused on the reduction of the reflected light from the substrate.

The anti-reflection methods may be classified largely into two groups by their working principle. One group of methods uses as an anti-reflective film a so-called photoabsorptive film with a strong capability to absorb exposure light, and the second group utilizes light interference to prevent reflection. As a representative for the former, an ARC (Anti-Reflective Coating) method is available, which applies a photoabsorptive organic film over the substrate before applying a resist. Light that has passed through the resist toward the substrate is absorbed by this photoabsorptive organic film before being reflected by the substrate surface, so that the light reflected from the substrate and returning to the resist is mitigated.

Examples of anti-reflective films of the second group include Si and TiN. The anti-reflective film of Si, $SiO_xN_y$:H, TiN, etc. is deposited over a metal such as W and Al to such a thickness that the reflected light from the resist/anti-reflective film interface and the reflected light from the anti-reflective film/substrate interface are in opposite phase with each other in order to reduce the reflection. Conventionally, these methods have been employed in reducing the reflection of light.

The ARC method is described in the Proceedings of SPIE, 1991, vol. 1463, pp. 16–29 and in Japan Patent Laid-Open No. 93448/1984. The anti-reflective film using light interference is described in Japan Patent Laid-Open No. 6540/1984 and 130481/1982, in the Proceedings of SPIE, 1994, vol. 2197, pp. 722–732 and in the Technical Digests of International Electron Device Meeting, 1982, pp. 399–402.

SUMMARY OF THE INVENTION

Regarding the problems of the conventional anti-reflection technology, explanations are given separately to the anti-reflection technology using light interference and to the ARC technology using light absorption.

The anti-reflection method using light interference requires the reflectivity of the resist/anti-reflective film interface and the reflectivity of the anti-reflective film/substrate interface to be equal in order to cancel the reflected light from these interfaces. Because the reflected light from the resist/anti-reflective film interface and the reflected light from the anti-reflective film/substrate interface need to be in opposite phase, the thickness of the anti-reflective film must be made constant at any location. This is close to impossible to realize on uneven surfaces of the substrate because, as shown in FIG. 2, a thickness 21 of a stepped portion of the anti-reflective film is greater than that of a thickness 22 of a planar portion. When the substrate surface layer is a transparent film such as a silicon oxide film, the reflected light from the reflective interface under the silicon oxide film and the reflected light from the resist/anti-reflective film interface must be set in opposite phase. This requires a precise film thickness control including the silicon oxide film. If the silicon oxide film is used as an inter-layer film on the uneven surface of the substrate, the film thickness control is impossible because the thickness of the silicon oxide film varies greatly depending on locations. In these cases, therefore, satisfactory anti-reflection cannot be obtained with the light interference anti-reflection film. There is another problem that, to make the reflectivities equal, it is necessary to optimize the complex index of refraction of the anti-reflective film material according to the substrate material (more precisely, the complex index of refraction of the substrate material). That is, the anti-reflection method using light interference makes it necessary to change the anti-reflective film material each time the substrate material is changed. The anti-reflection method therefore lacks versatility.

Because it deposits a film, the ARC method has the advantages of being simple and versatile, that is, it does not depend on the substrate material. On the other hand, the ARC method has a problem that the anti-reflective film has a large thickness and therefore this method is not suited for forming a microfine pattern. When there is a step in the substrate surface, the thickness 31 (see FIG. 3) of the anti-reflective film 30 over a stepped portion is smaller than the thickness 32 at the side of the stepped portion and the thickness 33 of the planar portion. This makes it necessary to set the thickness over the stepped portion greater than is required. Further, when performing lithography on a planar substrate, the anti-reflective film should be formed thick. To increase photoabsorbance in the anti-reflective film and at the same time reduce the film thickness requires increasing the photoabsorbance level of the anti-reflective film. As the photoabsorbance level increases the reflectivity of the interface between the anti-reflective film and the resist increases, making it impossible to produce a satisfactory reflection prevention effect. For example, when the extinction coefficient of the anti-reflective film, which indicates photoabsorption, exceeds 0.5, the interface reflection between the resist and anti-reflective film much increases. Hence, to obtain a sufficient reflection prevention effect, the thickness of the anti-reflective film needs to be increased. When a thick anti-reflective film is used, the ratio of film thickness to pattern width, i.e., an aspect ratio, becomes extremely large in microfine patterns, making the anti-reflective film very difficult to process. At the same time, the formed pattern will easily collapse, resulting in a faulty product. For example, if a 0.2 μm pattern is to be formed at ±5% precision, the reflectivity of the substrate needs to be kept within 0.23% (energy reflectivity). To achieve this reflectivity requires the thickness of the anti-reflective film to be 0.15 μm or greater because of the relationship between the above mentioned photoabsorbance level and the interface reflection. The aspect ratio for the pattern is 0.75. Finer patterns require higher dimensional precision and accordingly the reflectivity must be reduced further, forcing the thickness of the anti-reflective film and the aspect ratio to become still larger.

The present invention has been accomplished with a view to overcoming the above-mentioned problems experienced with conventional technologies.

That is, it is an object of this invention to provide a resist pattern forming method and an anti-reflective film used in the method, which can produce a satisfactory reflection prevention effect even when there are large steps in a substrate surface; which can be used widely irrespective of the substrate material without being affected by reflections from a substrate having a high reflectivity; which can produce a satisfactory reflection prevention effect even when the thickness of the anti-reflective film cannot be made large due to restrictions on the aspect ratio; and which can form microfine patterns with high dimensional precision.

It is a further object of the present invention to provide a resist pattern including an anti-reflective film, particularly useful in the preparation of semiconductor devices, especially in the preparation of microfine circuits of ULSI.

It is a still further object of the present invention to provide a method of etching a substrate (e.g., a layer on a member), especially for etching a substrate having an uneven surface (e.g., a layer on a member having an uneven surface), using a resist pattern including an anti-reflective film, and the product formed.

It is a still further object of the present invention to provide a method of forming a semiconductor device, especially an ULSI, including an etching process, e.g., to form a microfine circuit, the etching process using a resist pattern including an anti-reflective film, and the semiconductor device formed.

To solve the above problems and achieve the above objects, three methods were invented.

A first method is to form on the substrate to be processed an anti-reflective film whose exposure light absorbance is greater on the substrate surface side than on the resist surface side. This method solves the above problems and achieves the above objects.

The methods to change the photoabsorbance for exposure light include the following:

(1) After a film with a high photoabsorbance is formed over the substrate, the surface of the film is exposed to a liquid or gas chemical to diffuse the chemical into the film to decompose the light absorbing component that has reacted with the chemical and thereby to make the light absorbance distributed.

(2) After the film with a high exposure light absorbance is formed over the substrate, a mixing layer of the photoabsorbance film and a resist is generated when applying a resist so that the mixing layer has a variation in the photoabsorbance.

(3) The anti-reflective film is formed by CVD (chemical vapor deposition). During the process of forming this film, the condition of film forming (such as gas composition) is changed to change the photoabsorbance.

(4) The anti-reflective film is formed by sputtering. During the process of forming this film, the composition of ambient gas is changed to change the photoabsorbance.

(5) After the substrate is formed with a film containing a photoabsorptive compound which has a property of being evaporated by heat, the resulting formed film is heat-treated.

(6) The substrate is formed with a film, which has a property of absorbing pattern exposure light and also a property of absorbing light of a certain wavelength (photoabsorption modulation light), reacting with the photoabsorption modulation light and progressively losing the ability to absorb the pattern exposure light. Then, the entire surface of the film is irradiated with the photoabsorption modulation light to form an anti-reflective film whose pattern exposure light absorbance is smaller at the surface of the film than at a deep part of the film.

(7) The substrate is formed with a film, which has a property of absorbing pattern exposure light and also a property of absorbing light of a certain wavelength (photoabsorption modulation light), and, when subjected to heat treatment after being irradiated with the photoabsorption modulation light, progressively losing the ability to absorb the pattern exposure light. Then, the entire surface of the film is irradiated with the photoabsorption modulation light and then baked to form an anti-reflective film whose pattern exposure light absorbance is smaller at the surface of the film than at a deep part of the film.

A second method forms a two-layer reflective film consisting of upper and lower layers over the substrate. The upper layer is an interference film for the exposure light, and the lower layer has a higher exposure light absorbance than the upper layer.

A third method forms a two-layer film consisting of upper and lower layers over the substrate, with the upper layer working as an interference film for the exposure light and the lower layer reflecting the exposure light. The upper layer may be formed as a single-layer film or a multi-layer film.

These methods solve the above-mentioned problems and achieve the above-mentioned objects of the present invention.

The working of the first method is described below.

The reason that increasing the photoabsorbance level of the anti-reflective film does not necessarily result in a decreased reflectivity is that the reflectivity of the interface between the anti-reflective film and the resist increases as the photoabsorbance level of the anti-reflective film rises. Let the complex index of refraction of the anti-reflective film and resist be $n_1 - ik_1$ and $n_2 - ik_2$. The intensity of light passing through the anti-reflective film attenuates by $\exp(-4\pi k_1 d/\lambda)$. Reflected light of $((n_1-n_2)^2+(k_1-k_2)^2)/((n_1+n_2)^2+(k_1+k_2)^2)$ is generated at the resist/substrate interface. As the $k_1$ representing the photoabsorbance level increases, the reflection from the interface between the anti-reflective film and the resist increases. Symbol d represents the film thickness of the resist and $\lambda$ represents the wavelength of the exposure light. $k_1$ and $k_2$ are also called extinction coefficients for respective materials.

This invention gradually changes the photoabsorbance of the anti-reflective film beginning with its surface to prevent reflection from the resist/anti-reflective film interface while providing the film with a high photoabsorbance level, thus securing a high anti-reflection effect. That is, by progressively changing the extinction coefficient k starting with the resist and ending with the reflection is a film, the reflection is attenuated. Although a slight reflection is generated each time k changes, because the reflection surface shifts slightly at each change, the phase of the reflected light changes slightly canceling the beams of reflected light. As a result, the overall reflection decreases. Because the reflection from the interface is reduced for this reason even when the extinction coefficient of the anti-reflective film is large, a high reflection prevention effect can be produced. Since the extinction coefficient of the anti-reflective film can be increased without a restriction of the interface reflection, the use of this anti-reflective film assures a satisfactory reflection prevention even with a substrate having a high reflectivity or with a substrate whose upper layer is transparent. Especially when the extinction coefficient $k_1$ of the anti-reflective film exceeds 0.6, this method has an extreme anti-reflective effect.

The interface reflection prevention utilizes a sort of interference phenomenon. Because what is utilized for the interference phenomenon is only a portion of a certain thickness on the upper surface side of the anti-reflective film, a sufficient anti-reflection effect can be obtained even when the film thickness of the anti-reflective film changes, as long as it is thicker than a certain thickness. Therefore, the reflection prevention is not influenced by stepped portions in the substrate surface.

On the other hand, the conventional anti-reflective film using the interference phenomenon has the reflected light from the resist/anti-reflective film interface and the reflected light from the anti-reflective film/substrate interface interfere with each other. Hence, when the film thickness of the entire anti-reflective film changes, a sufficient reflected light attenuation effect cannot be obtained, leaving the reflection prevention to be greatly influenced by the stepped portion on the substrate surface. The portion in the anti-reflective film whose light absorbance varies should preferably have at least $\lambda/4n_A$, where $n_A$ represents an average refractive index (real part) of the anti-reflective film within that film thickness and $\lambda$ represents the wavelength of the exposure light. It is particularly desirable that the portion has a thickness equal to an odd number times $\lambda/4n_A$. The methods of progressively changing the value of k along the depth direction include one that continuously changes k and one that changes it stepwise little by little. When the diffusion phenomenon and the mixing phenomenon are utilized, the continuously changing method is easier in terms of process.

The methods (6) and (7) described in the foregoing first form over the substrate an anti-reflective film, which has a property of absorbing the pattern exposure light and a certain kind of light (referred to as photoabsorption modulation light), and which, upon reacting with the photoabsorption modulation light, loses the property of absorbing the pattern exposure light. These methods then irradiate the photoabsorption modulation light against the entire surface of the anti-reflective film. The photoabsorption modulation light attenuates in the anti-reflective film according to Lambert-Beer's law and its attenuation distribution in the direction of propagation of the photoabsorption modulation light starts from the surface of the anti-reflective film. At the same time, there is generated a photoabsorption distribution of the pattern exposure light beginning with the surface of the anti-reflective film. That is, as indicated by a photoabsorption characteristic curve 51 in FIG. 5—in which the position of the surface of the anti-reflective film is represented by 0 and the film thickness is represented by d—there is produced in the anti-reflective film a photoabsorption distribution, in which the photoabsorption of the pattern exposure light is weak at position 0 on the surface of the film and then progressively increases in the direction of depth. This distribution starts with the surface of the film and thus does not change even when the thickness of the anti-reflective film varies according to locations due to the stepped portions in the substrate as shown in FIG. 3. That is, the pattern exposure light absorption distribution for the-thin film area at the top of the stepped portion (34 of FIG. 3) and that for the thick film area at the bottom of the stepped portion (35 of FIG. 3) are hardly different from each other, as shown in FIG. 6. The photoabsorption distributions are equal up to the depth $d_o$ to which the photoabsorption modulation light penetrates, and in deeper areas they exhibit constant photoabsorptions. Symbols $d_1$ and $d_2$ in FIG. 6 represent the positions on the substrate for the levels 34 and 35, with the surface of the anti-reflective film taken as 0, and have the same values as the film thicknesses 31 and 32. To describe more precisely, it is not in the direction, of film thickness but in the direction of light propagation that the photoabsorption distribution does not change. When, for example, the surface of the anti-reflective film has a slope caused by the stepped portions of the substrate, the photoabsorption modulation light 41, as shown in FIG. 4, bends at the surface of the anti-reflective film. In this bent direction the same photoabsorption distribution can be obtained. In FIG. 4, reference numeral 42 represents a substrate with a stepped portion; 43 a portion of the anti-reflective film in which the absorption level (extinction coefficient) changes (i.e., there is a gradient in photoabsorption); and 44 a portion of the anti-reflective film that has a constant photoabsorption level. Because the pattern exposure light also bends at the interface of the anti-reflective film, a uniform photoabsorption distribution for the pattern exposure light can be obtained, thus reducing reflection without being influenced by stepped portions.

With this process, the extinction coefficient k can be varied gradually from the resist to the anti-reflective film, thereby reducing the reflection that is caused by rapid change of k. Although a slight reflection is generated each time k changes, because the reflection surface is shifted progressively, the phase of the reflected light changes little by little, producing a canceling effect. Thus, the reflection as a whole decreases. Because the reflection from an interface is reduced in this way, a high reflection prevention effect can be obtained even if the extinction coefficient of the anti-reflective film is large. Since the extinction coefficient of the anti-reflective film can be increased without a restriction of the interface reflection, the use of this anti-reflective film ensures a satisfactory reflection prevention either with a substrate having a high reflectivity or with a substrate whose upper layer is transparent. The interface reflection prevention utilizes a sort of interference phenomenon. Because what is utilized for the interference phenomenon is only a portion of a certain thickness on the upper surface side of the anti-reflective film, a sufficient anti-reflection effect can be obtained even when the thickness of the anti-reflective film changes, as long as it is thicker than the certain thickness. Further, because the thickness used for the interference effect is well controlled in the direction of light travel, the anti-reflection rate is high. Therefore, the reflection prevention is not influenced by the stepped portions of the substrate. On the other hand, the conventional anti-reflective film using the interference phenomenon has the reflected light from the resist/anti-reflective film interface and the reflected light from the anti-reflective film/substrate interface interfere with each other. Hence, when the film thickness of the entire anti-reflective film changes, a sufficient reflection attenuation effect cannot be obtained, leaving the reflection prevention to be greatly influenced by the stepped portion on the substrate surface. The portion in the anti-reflective film whose light absorbance varies (43 in FIG. 4 and $0-d_o$ position range in FIG. 6) should preferably be at least $\lambda/4n_A$, where $n_A$ represents an average refractive index (real part) of the anti-reflective film within that film thickness and $\lambda$ represents the wavelength of the exposure light. It is particularly desirable that the portion has a thickness equal to an odd number times $\lambda/4n_A$.

The anti-reflective film, which has the property of absorbing the pattern exposure light and, upon reaction with the photoabsorption modulation light, loses the property of absorbing the pattern exposure light, can be produced by diffusing in an organic film a photoabsorptive compound that becomes transparent as it is exposed to light, a so-called bleaching characteristic. Alternatively, it may be obtained by using a film, which has a property of absorbing photoabsorption modulation light, and, when subjected to heat treatment or chemical treatment after being irradiated with the photoabsorption modulation light, losing the ability to absorb the pattern exposure light.

An illustrative (but not limiting) group of compounds having this bleaching characteristic is the nitrone compounds. These compounds are described in Hamer, et al., Chem. Rev., 64, 472 (1964) at 474, the contents of which are incorporated herein by reference in their entirety, and are compounds containing the group:

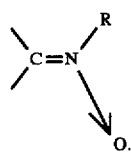

A specific type of nitrone which can be used in the present invention is set forth in the following:

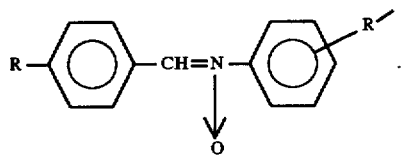

When this specific type of nitrone is irradiated with light (hv), it reacts to form the following compound (bleached):

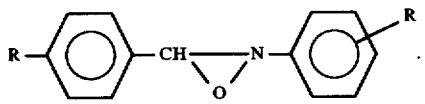

The working of the second method is described below.

The lower layer has a high absorbance of exposure light and shields light reflected from the substrate. The lower layer therefore offers a satisfactory reflection prevention effect even with a substrate with high reflectivity and a substrate having a transparent film. Because the shielding of reflected light from this substrate uses a photoabsorption effect, not interference, it does not depend on the material of the-substrate. Generally, however, the use of a photoabsorptive film that is thin and able to shield well the reflected light from the substrate results in an increased imaginary part of the refractive index (extinction coefficient) of the anti-reflective film and an increased reflectivity at the resist/anti-reflective film interface, making it impossible to produce a good reflection prevention effect. This method solves this problem by using the interference film of the upper layer. That is, the reflected light from the resist/upper layer anti-reflective film interface and the reflected light from the upper layer anti-reflective film/lower layer anti-reflective film interface with each other in such a way that these reflected lights cancel each other (the upper layer film thickness is set so that the phases of the reflected lights are opposite to each other). The combined effect of the interface reflection reduction by the upper layer anti-reflective film and the substrate reflection reduction by the lower layer anti-reflective film solves the above problem.

The working of the third method is explained below.

The anti-reflective film of the third method consists of an upper layer film and a lower layer film. By reflecting the exposure light by the lower layer film, phase and intensity control of the reflected light can be achieved. That is, because the reflecting surface is not the substrate surface but the lower layer film surface, the reflected light has a constant phase and intensity regardless of optical constants of the substrate and whether there is a transparent film or not. The reflected light is cut by the upper layer's interference film. In other words, the reflected light from the resist/upper layer anti-reflective film interface and the reflected light from the upper layer anti-reflective film/lower layer anti-reflective film interface are made to interfere with each other so that they cancel each other (the upper layer film thickness is set so that the phases of the reflected lights are opposite). The reason that the reflected light can be cut by the upper layer's interference film is that the phase and intensity of the reflected light can be kept constant. This is achieved by the introduction of the reflective film. The fact that a reflective film is introduced in realizing the reflection prevention is a feature of this aspect of the present invention.

DETAILED DESCRIPTION OF THE INVENTION

In the following description, the present invention is described in connection with specific and preferred embodiments. It will be understood that the present invention is not limited to these embodiments, but rather is to be construed to be of the spirit and scope defined by the appended claims.

In the present specification, the structure and process are described as comprising specific components and steps, respectively. It is within the contemplation of the present inventors that the structure and process can consist essentially of, or consist of, the disclosed components and steps, respectively.

Embodiment 1

Figure 1A:
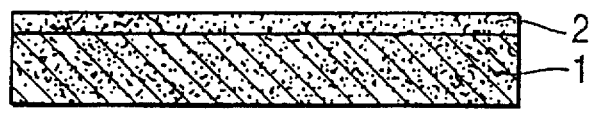
FIGS. 1(a)–(e) are cross sections illustrating the process of a first embodiment of this invention.
Figure 1B:
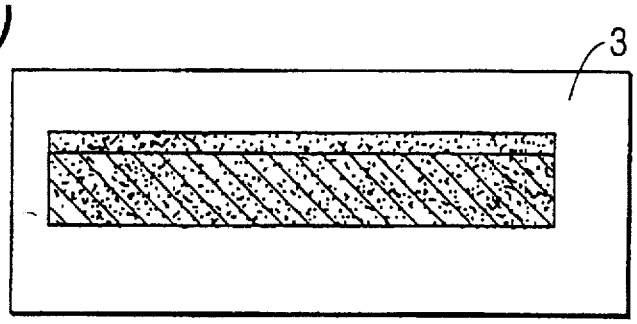

An embodiment of this invention will be described by referring to FIGS. 1(a)–(e), illustrating the process. First, as shown in FIG. 1(a), an organic matter 2 containing a nitrone compound was applied over the substrate 1 to a thickness of 0.2 µm. Although this figure shows the substrate without a step, the substrate may have a step. Next, as shown in FIG. 1(b), the substrate 1 having the organic matter 2 was exposed in an HCl containing gas 3 for 2 minutes. As a result, the HCl gas penetrated into the organic matter 2 to a depth of about 0.15 µm. Here, the photoabsorbance change reference depth $\lambda/4n_A$ for the interface reflection prevention is about 0.05 µm for i line radiation (wavelength 365 nm), and the depth in this embodiment is about 3 times (odd number times) the reference depth. The $n_A$ of the organic matter 2 is about 1.65. The nitrone compound in the area in which HCl penetrated underwent a cyclic reaction depending on the concentration of HCl, reducing the photoabsorbance level for the i line radiation. Because the density of HCl is high at the surface of the organic matter 2, it was possible to form over the substrate an anti-reflective film for the i line radiation, whose photoabsorbance is small at the surface of the organic matter 2 and continuously increases in the direction of depth.

Figure 1C:
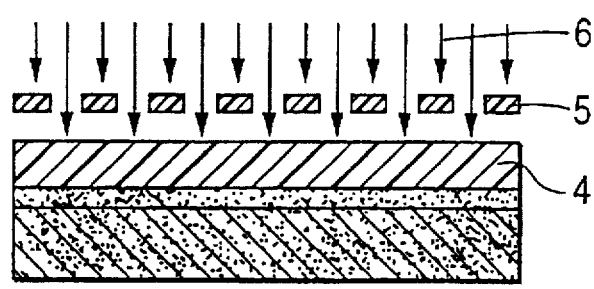
Figure 1D:
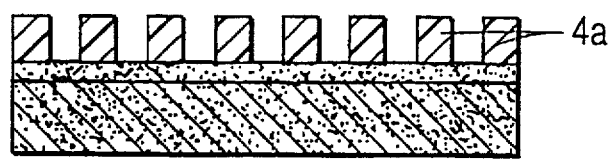
Figure 1E:
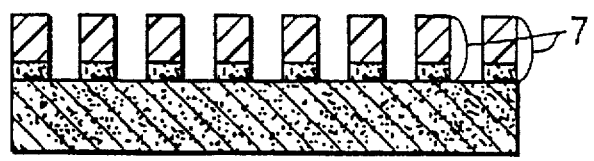

Although in this case HCl gas was used, an HCl solution may be used. One of the differences between the two is the penetration depth, with gas penetrating deep and the HCl solution penetrating only a shallow depth. They can be selected according to the setting of depth. For example, in the case of an ArF excimer laser exposure light (wavelength 193 nm), a microfine pattern is required to be formed and the anti-reflective film needs to be extremely thin. In such a case, the HCl solution is advantageous. Then, as shown in FIG. 1(c), a resist 4 was applied and baked, and then irradiated with an exposure light 6 through a mask 5 in an ordinary manner. Here, the exposure light used an i line radiation. Although the figure shows the mask set close to the substrate during exposure, it is possible to perform the exposure through a lens, or mirror. Next, as shown in FIG. 1(d), the exposed film was developed to form a resist pattern 4a in an ordinary way. After this, as shown in FIG. 1(e), with the resist pattern 4a as a mask, the organic matter 2 (anti-reflective film) was etched to form a resist pattern 7 including a processed anti-reflective film over the substrate.

The resist pattern formed by this anti-reflection method was about 10% better in the dimensional precision than when a conventional anti-reflection method was used.

Features of this method include that it is simple in equipment configuration and uses an applied organic film that is easily removed, and that it can control an absorption coefficient variation region by changing the diffusion length of gas or solution into the organic film, thereby allowing easy application of this method to a variety of kinds of exposure process.

Embodiment 2

Figure 7A:
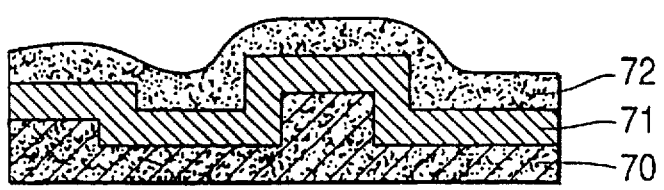
FIGS. 7(a)–(e) are cross sections illustrating the process of a second embodiment of this invention.

A second embodiment of this invention is described by referring to FIGS. 7(a)–(e). First, as shown in FIG. 7(a), an organic film 72 was applied over the substrate and heat-treated at 100° C. The thickness of the applied film was 0.08 µm over the planar surface. In areas where the film is thin due to a step on the substrate, the film thickness was 0.05 µm; and in thick areas it was 0.15 µm. The substrate is a silicon wafer 70 having an uneven surface or stepped portions, covered with an aluminum film 71 (containing 2% silicon) to a thickness of 0.2 µm. The organic film used a novolac resin. Although the substrate is shown to have steps here, it need not be provided with steps.

Figure 7B:
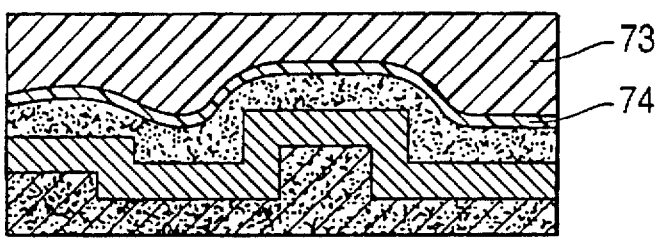

Next, a shown in FIG. 7(b), a resist 73 was applied over the organic film 72. The resist used PMMA (polymethyl methacrylate) and was heat-treated at 200° C. after application. At this time, a mixing layer 74 of PMMA and the novolac resin was formed at the interface between the resist 73 and the organic film 72. The thickness of the mixing layer was about 0.035 µm, equal to the photoabsorbance change reference depth $\lambda/4n_A$ for preventing interface reflection of ArF excimer laser light. Although the thickness of the organic film 72 varied from one location to another because of the stepped portions on the substrate, the thickness of this mixing layer was constant.

Figure 7C:
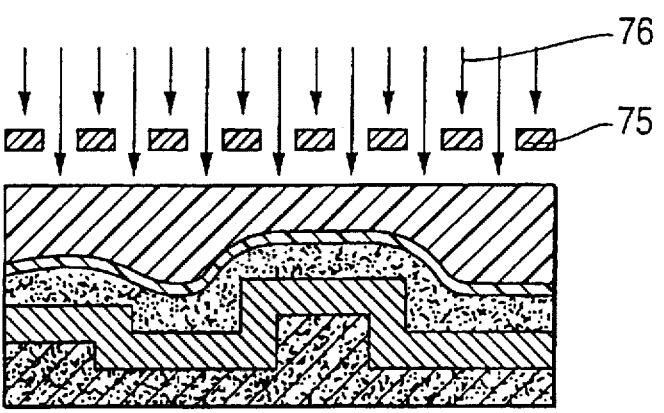

The surface of the mixing layer on the resist side was PMMA-like and the surface on the organic film side was novolac-like. The extinction coefficient of PMMA for ArF excimer laser light is 0.018, and that of the heat-treated novolac resin is about 1. The extinction coefficient of the mixing layer was about 0.02 on the upper surface (resist surface) side and about 1 on the lower surface (organic film) side, with the extinction coefficient in between changing continuously. Then, as shown in FIG. 7(c), the resist 73 was irradiated with an exposure light 76 through a mask 75 in an ordinary manner. Here, an ArF excimer laser beam was used for the exposure light. The organic film 72 and the mixing layer 74 function as anti-reflective films. While the mask is shown close to the film, it is possible to perform exposure through a lens or mirror.

Figure 7D:
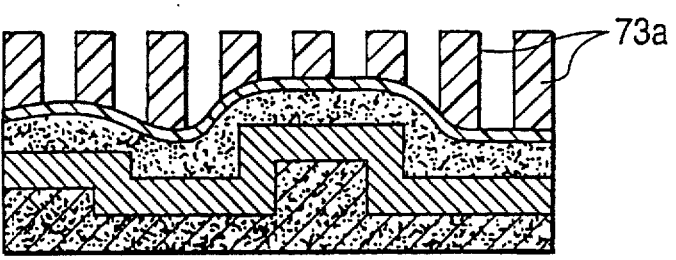
Figure 7E:
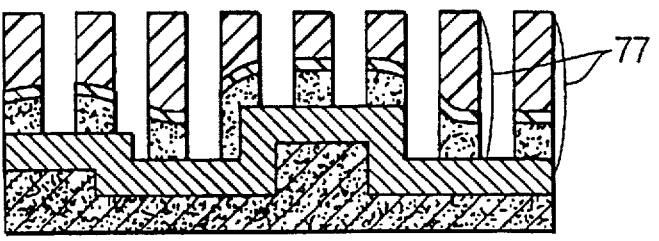

Next, the resist 73 was developed to form a resist pattern 73a according to ordinary procedures, as shown in FIG. 7(d). Then, as shown in FIG. 7(e), with the resist pattern 73a as a mask, the mixing layer 74 and the organic film 72 (anti-reflective film) were etched to form a resist pattern 77 including a processed anti-reflective film.

This anti-reflection method was used to form a 0.15-μm pattern, whose dimensional accuracy was 10%. When the ARC anti-reflection method (conventional anti-reflection method) with film thickness of 0.08 μm was used, the dimensional accuracy was 20% even after the photoabsorption coefficient was optimized. Increasing the film thickness of ARC posed a problem of dimensional shift and collapse of resist pattern during etching.

Another advantage of the mixing layer is that it works as a bonding layer making pattern collapse (peeling) unlikely.

The key point of this embodiment is forming the mixing layer. Instead of PMMA resist, another resist could also be used, as discussed in the following. After the mixing layer is formed, the PMMA resist can be removed by DUV (deep ultraviolet) irradiation and development. After that, a resist can be spun on the mixing layer and baked in a conventional manner. Then exposure and development is performed. Thereafter, the mixing layer and organic film thereunder are etched to form a resist pattern including a processed anti-reflection film.

Embodiment 3

Figure 8A:
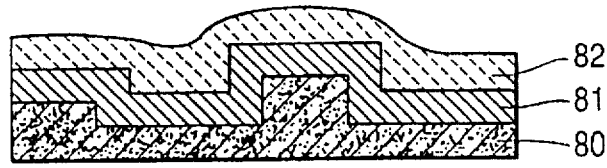
FIGS. 8(a)–(f) are cross sections illustrating the process of a third embodiment of this invention.

A third embodiment of this invention is described by referring to FIGS. 8(a)–(f). First, as shown in FIG. 8(a), a silicon wafer 80 as a substrate with steps was deposited with an aluminum film 81 (containing 2% silicon) to a thickness of 0.3 μm, and then with a PSG (phospho-silicate glass) film 82. In areas where the PSG film was thin due to steps of the substrate, the film thickness was 0.3 μm; and in thick areas it was 0.6 μm. The PSG film is transparent to a KrF excimer laser beam (wavelength 248 nm).

Figure 8B:
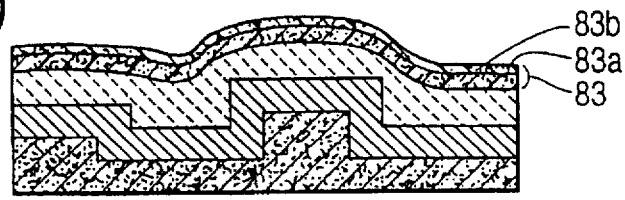
Figure 11:
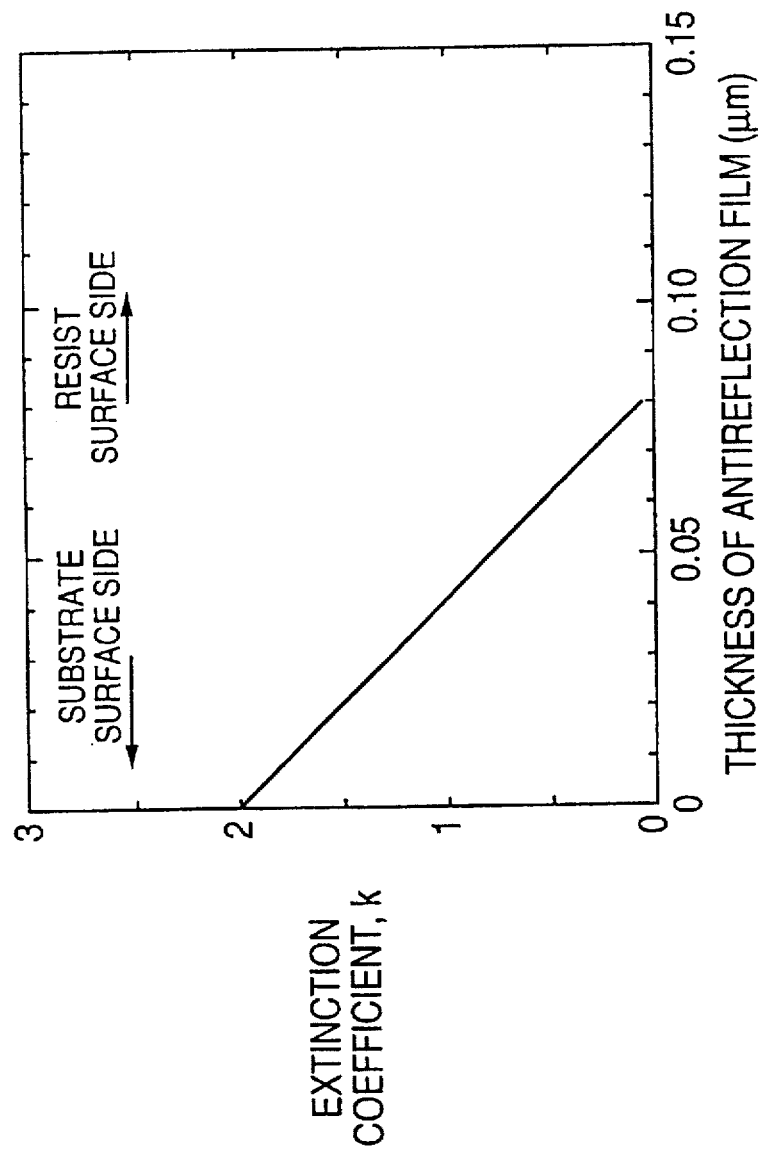
FIG. 11 is a photoabsorption characteristic diagram of the anti-reflective film of the third embodiment.

Next, as shown in FIG. 8(b), a SiOxNyHz film 83 was deposited over the PSG film by a plasma CVD (chemical vapor deposition) method. The SiOxNyHz film 83 was formed by using a gas mixture of silane and nitrous oxide and changing the ratio of the mixture during the film forming. Illustratively, the ratio changed from an initial ratio of SiH$_4$/N$_2$O of 2.9 to a final ratio of 0.1, respectively changing k from 2.0 to 0.02. The thickness of the SiOxNyHz film 83 was set to 0.08 μm. As shown in FIG. 11, the first 0.05 μm (83a of FIG. 8) was deposited with such a gas mixture ratio that the extinction coefficient for the KrF excimer laser beam was 2. Then, the gas mixture ratio was slowly changed, so that the extinction coefficient on the resist surface side was 0.02. Because it was a CVD film, the film was able to be formed with a uniform thickness despite the fact that there were steps on the substrate. These are advantages of the CVD method.

Figure 8C:
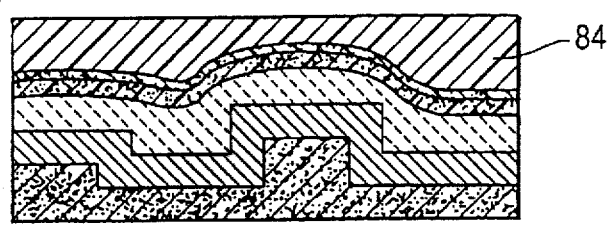
Figure 8D:
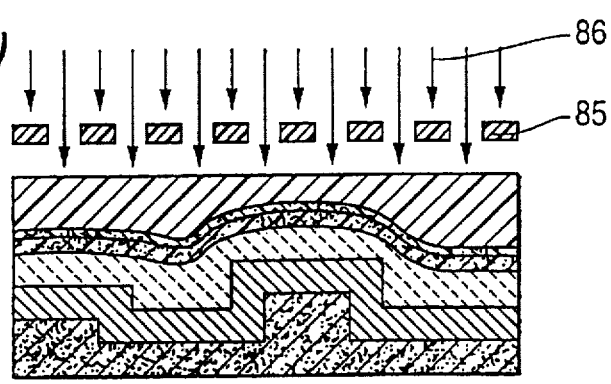

Next, as shown in FIG. 8(c), the SiOxNyHz film 83 (anti-reflective film) was deposited with a resist 84, which is XP89131 (Shipley: trade name). XP89131 is a chemically amplified resist. A chemically amplified resist has at least a photo acid generator (PAG). When irradiated, the PAG generates acid; and when the irradiated resist is then heated, the acid acts as a catalyst. The extinction coefficient of this resist for a KrF excimer laser beam is 0.02, equal to the extinction coefficient of the surface of the SiOxNyHz film 83. Then, as shown in FIG. 8(d), the resist 84 is irradiated with exposure light 86 through a mask 85 according to a conventional procedure. A KrF excimer laser beam was used for the exposure light. Though not shown, this exposure used a stepper with a lens numerical aperture of 0.45. This is only one example of experimental conditions, and a proximity exposure method may be used instead.

Figure 8E:
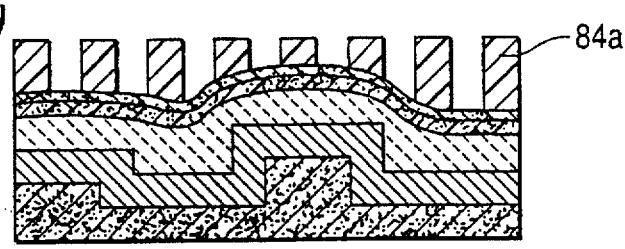
Figure 8F:
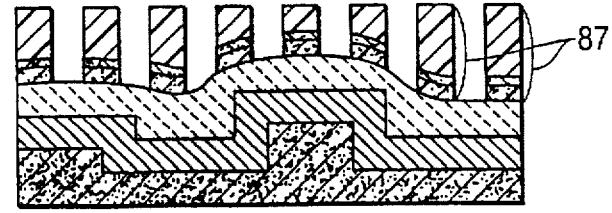

Then, as shown in FIG. 8(e) the resist 84 was developed to form a resist pattern 84a according to a conventional procedure. After this, with the resist pattern 84a as a mask, the SiOxNyHz film 83 was etched to form a resist pattern 87 including a processed anti-reflective film, as shown in FIG. 8(f).

This anti-reflection method was used to form a 0.25-μm pattern, whose dimensional accuracy was found to be 5%. When conventional CVD type and ARC type anti-reflective films with 0.08-μm thickness were used, the dimensional accuracy could not be improved from 10%, however much the photoabsorption coefficient was optimized.

Embodiment 4

Figure 9A:
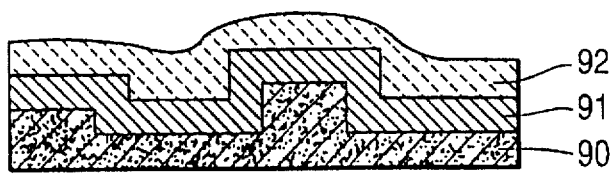
FIGS. 9(a)–(f) are cross sections illustrating the process of a fourth embodiment of this invention.

A fourth embodiment of this invention is explained by referring to FIGS. 9(a)–(f). As shown in FIG. 9(a), a silicon wafer 90 as a substrate with steps is deposited with a tungsten film 91 to a thickness of 0.2 μm and then with an SOG (spin on glass) film 92. In areas where the SOG film was thin due to steps of the substrate, the film thickness was 0.2 μm; and in thick areas it was 0.5 μm. The SOG film is transparent to a KrF excimer laser beam (wavelength 248 nm).

Figure 9B:
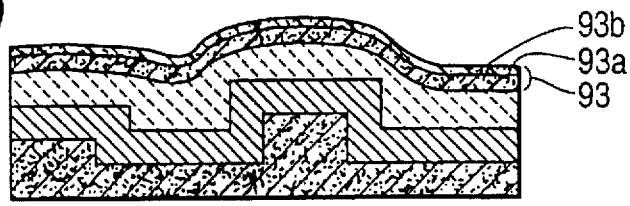

Next, as shown in FIG. 9(b), a SiNx film 93 was formed over the SOG film by a DC sputtering method, with silicon as a target and with a gas mixture of Ar and N$_2$ forming the ambient gas. The thickness of the SiNx film was set to 0.07 μm. The first 0.042 μm (93a of FIG. 9) was deposited with a gas mixture ratio that produced the extinction coefficient for the KrF excimer laser beam of 2.8. Then, the gas mixture ratio was gradually changed to deposit the remaining 0.028 μm (93b of FIG. 9). Deposition of the remaining 0.028 μm started with the extinction coefficient of 2.8 and ended with 0.02. In changing the gas mixture ratio, N$_2$ flow was increased. Illustratively, initially, the gas was solely Ar (i.e., N$_2$=0%); N$_2$ flow started and increased such that at the end N$_2$=30% by volume (Ar:N$_2$=7:3). This film is formed by sputtering, so that there is little dust generated in the processing equipment, and the film produced has few defects. This is an advantage of the sputtering method.

The average refractive index (real part) of the SiNx film was 2.2 for the KrF excimer laser beam. Hence, the photoabsorbance change reference depth λ/4n$_A$ for preventing interface reflection of this light was about 0.028 μm, almost equal to the film thickness of a portion of the SiNx film in which the extinction coefficient changed.

Figure 9C:
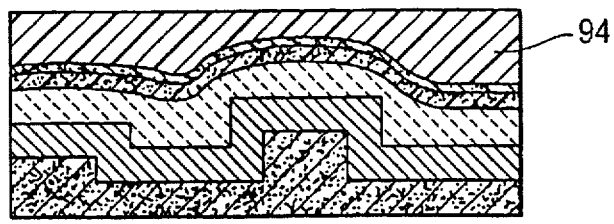

Next, as shown in FIG. 9(c), the SiNx film 93 (anti-reflective film) was covered with a resist 94, which is XP89131 (Shipley: trade name). The extinction coefficient of this resist for KrF excimer laser beam is 0.02, equal to the extinction coefficient of the surface of the SiNx film.

Figure 9D:
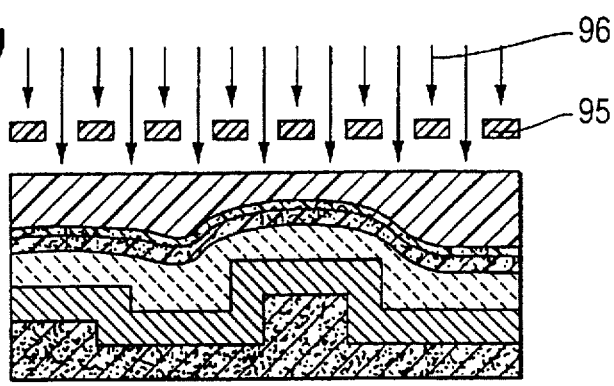
Figure 9E:
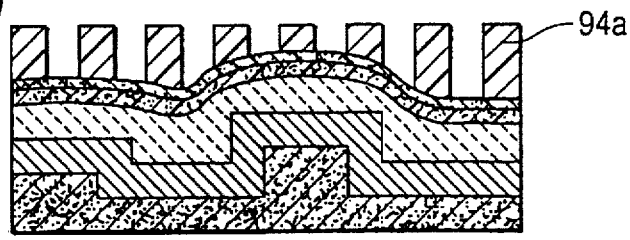
Figure 9F:
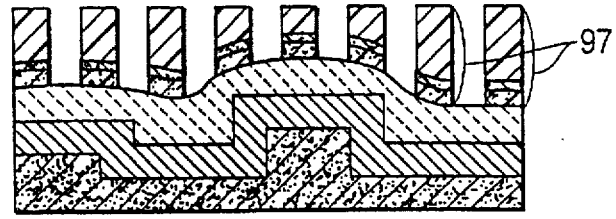

After this, as shown in FIG. 9(d), the resist 94 is irradiated with exposure light 96 through a mask 95 according to a conventional procedure. A KrF excimer laser beam was used for the exposure light. Though not shown, this exposure used a stepper with a lens numerical aperture of 0.45. This is only one example of experimental conditions, and a proximity exposure method may be used instead. Next, as shown in FIG. 9(e), the resist 94 was developed to form a resist pattern 94a according to a conventional procedure. After this, with the resist pattern 94a as a mask, the SiNx film 93 was etched to form a resist pattern 97 including a processed anti-reflective film, as shown in FIG. 9(f).

This anti-reflection method was used to form a 0.25-μm pattern, whose dimensional accuracy was found to be 5%. When conventional CVD type and ARC type anti-reflective films with 0.07-μm thickness were used, the dimensional accuracy could not be improved from 10% no matter how much the photoabsorption coefficient was optimized.

As seen in Embodiments 3 and 4, changing x and y in SiOxNyHz, and x in SiNx, changes both refractive index (real part) and extinction coefficient, with respect to both KrF excimer laser radiation and i line radiation. The effect of the change in x and y is shown in the following Tables 1 and 2, respectively in connection with SiOxNyHz films formed by CVD and SiNx films formed by sputtering.

TABLE 1

CVD (SiOxNyHz)

| composition | refractive index n | k | wavelength |
|---|---|---|---|
| x ↗ | → | ↘ | KrF (248 nm) |
|  | ↘ | ↘ | i-line (365 nm) |
| y ↗ | → | ↘ | KrF (248 nm) |
|  | ↘ | ↘ | i-line (365 nm) |

TABLE 2

Sputter (SiNx)

| composition | refractive index n | k | wavelength |
|---|---|---|---|
| x ↗ | ↗ (change is small) | ↘ (change is large) saturation point is ≅ 0.4 (when x ≧ 0.4, n&k ≅ constant) | KrF (248 nm) |
|  | ↘ (change is large) saturation point is ≅ 0.4 | ↘ (change is large) | i-line (365 nm) |

Generally, silicon-rich films have a high extinction coefficient; and when z is less than 0.02, the refractive index is relatively insensitive to a change in z.

Embodiment 5

A fifth embodiment of this invention is explained by referring to FIGS. 10(a)–(e). First, as showing FIG. 10(a), a substrate 101 was deposited with an organic substance 102 to a thickness of 0.1 μm, which forms an anti-reflective film. This organic substance is a novolac resin containing anthracene as a photoabsorptive compound. Although this figure shows the substrate without a step, it may have steps. After the organic substance 102 was applied, the wafer was subjected to 100° C. heat treatment. The heat treatment evaporates anthracene present near the surface of the organic film, generating a distribution of the photoabsorptive compound. That is, the concentration of the photoabsorptive compound is high on the substrate side and low on the surface side.

Figure 10A:
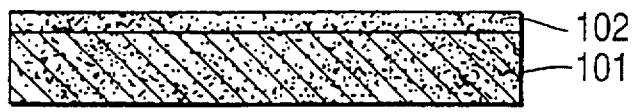
FIGS. 10(a)–(e) are cross sections illustrating the process of a fifth embodiment of this invention.
Figure 10B:
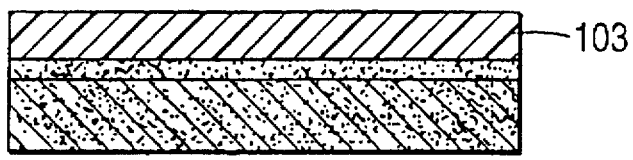
Figure 10C:
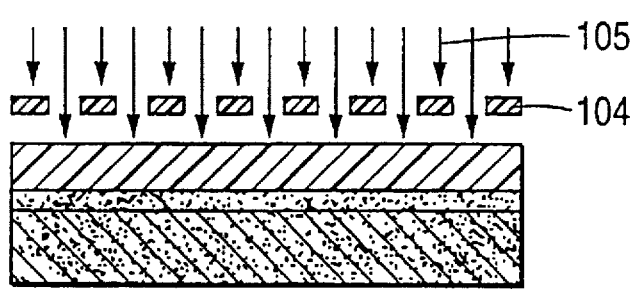
Figure 10D:
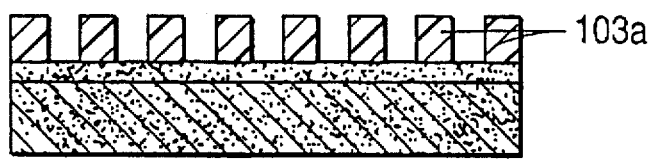
Figure 10E:
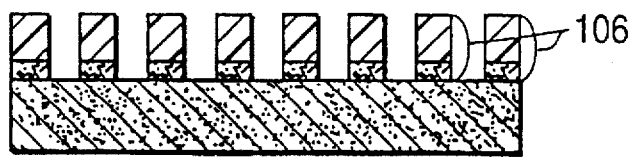

Next, as shown in FIG. 10(b), the substrate 101 formed with the organic film 102 was deposited with a water soluble resist 103. Then, as shown in FIG. 10(c), the resist 103 was irradiated with exposure light 105 through a mask 104 according to a conventional process. A KrF excimer laser beam was used for the exposure light. While the mask is shown close to the film, it is possible to perform exposure through a lens or mirror. Next, as shown in FIG. 10(d), the resist 103 was developed to form a resist pattern 103a according to a conventional process. After this, the organic film 102 (anti-reflective film) was etched, with the resist pattern 103a as a mask, to form a resist pattern 106 including a processed anti-reflective film over the substrate.

The resist pattern formed by this anti-reflection method was about 10% better in the dimensional precision than when a conventional anti-reflection method was used.

Anthracene used as a photoabsorptive compound may be replaced with an anthracene derivative. That is, the substituent group may be changed from hydrogen to a methyl group, a methoxy group, an ethyl group or chlorine. Because the volatility changes according to the substituent group, it is possible to widen the heat treatment conditions for the organic film and resist by changing the substituent group.

Features of this method are being able to provide a film-forming apparatus which is simple in equipment configuration, and to produce an optimum anti-reflective film by a baking furnace.

Embodiment 6

Figure 12A:
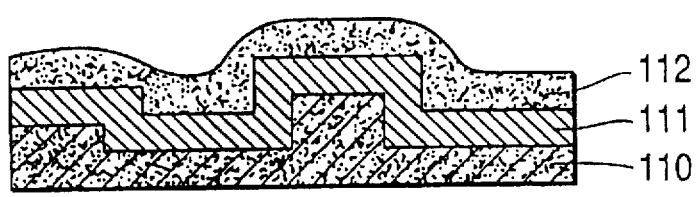
FIGS. 12(a)–(e) are cross sections illustrating a sixth embodiment of the invention.

A sixth embodiment of this invention is described by referring to FIGS. 12(a)–(e). First, the substrate is deposited with an organic film 112 and heat-treated at 100° C., as shown in FIG. 12(a). The film thickness was set to 0.1 μm over a planar surface. In areas where the film was thin due to steps on the substrate surface, the film thickness was 0.06 μm. In thick areas, it was 0.18 μm. Because i line irradiation (wavelength 365 nm) was used for the pattern exposure light, the photoabsorbance change reference depth $\lambda/4n_A$ for prevention of interface reflection was about 0.05 μm, which, is thinner than the thickness of the organic film. The organic film 112 used a nitrone compound, a bleaching photoabsorptive compound. As a substrate, a silicon wafer 110 having steps and deposited with an aluminum film 111 (containing 2% silicon) to a thickness of 0.2 μm was used.

Figure 12B:
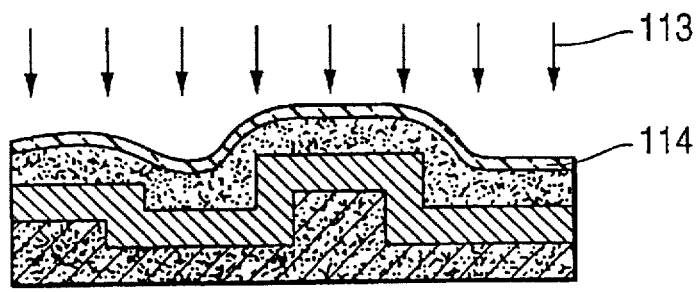

Next, as shown in FIG. 12(b), the whole surface of the wafer was irradiated with i line radiation 113. The flood exposure light (photoabsorption modulation light) 113 transformed a surface portion of the organic film 112 into a layer 114, which is transparent at its surface and which has a photoabsorbance level distribution in which the photoabsorbance level increases into the layer in the direction of its thickness. The i line radiation was used for the photoabsorption modulation light because of the characteristic of the photoabsorptive compound used, and the wavelength of the flood exposure light is of course changed if the photoabsorptive compound is changed. The fact that the flood exposure light 113 and a pattern exposure light 117 described later agreed in wavelength is because of the use of this photoabsorptive compound. When the photoabsorptive compound is changed, the wavelengths of the flood exposure light and the pattern exposure light will of course change.

Figure 12C:
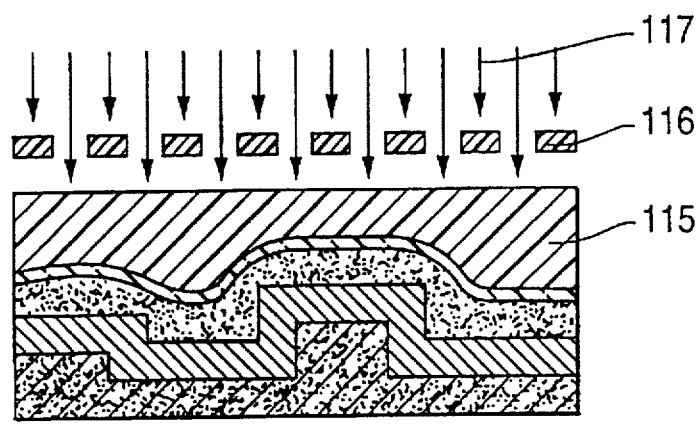
Figure 13:
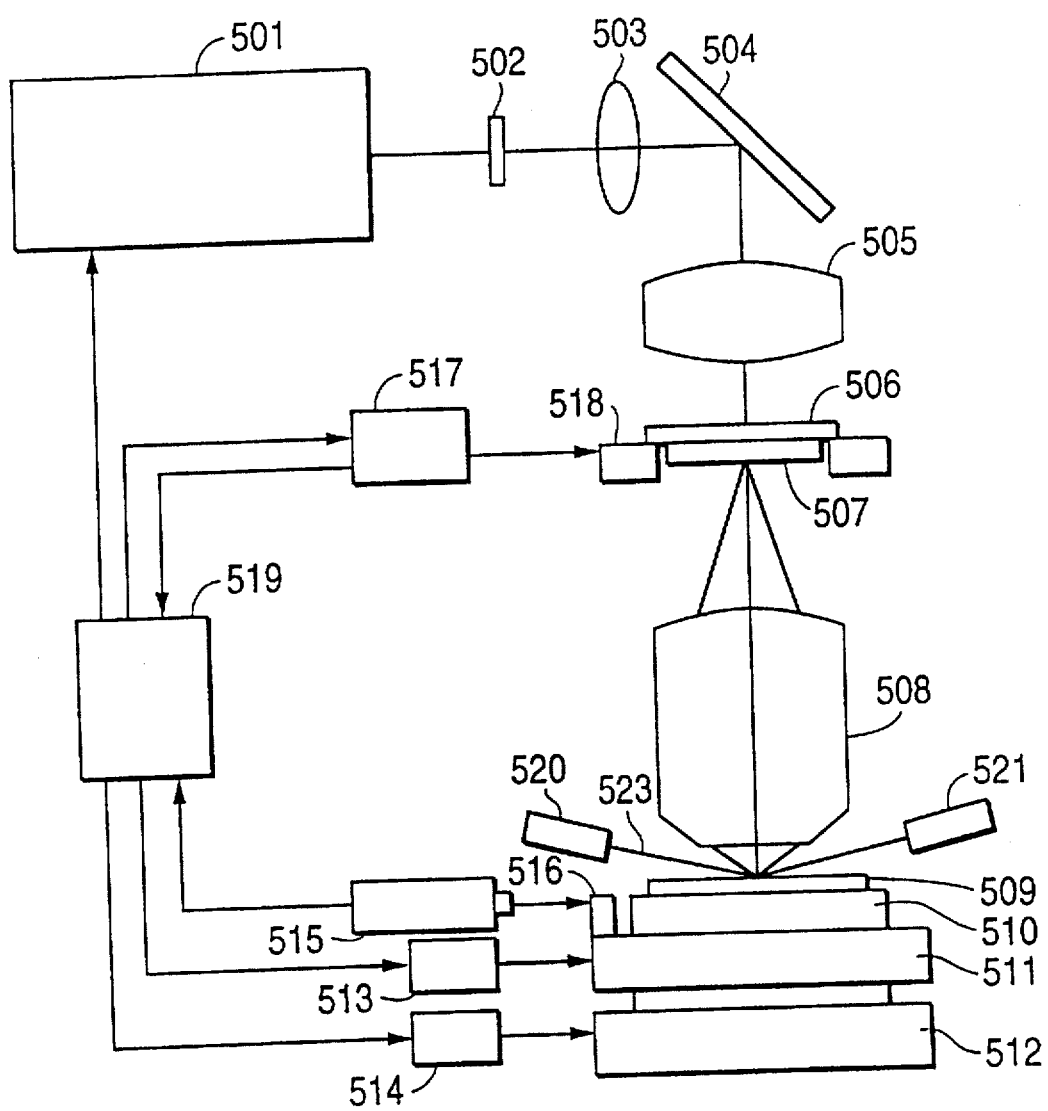
FIG. 13 is a schematic diagram showing the configuration of a projection and exposure apparatus implementing this invention.

Then, as shown in FIG. 12(c), after a resist 115 was applied to the organic film 112, exposure light 117 was applied to the resist through a mask 116 according to a conventional procedure. An i line radiation was used for the exposure light as mentioned earlier. While the mask is shown close to the film, it is possible to perform exposure through a lens or mirror. The equipment configuration for the latter case is shown in FIG. 13. In the figure, light from a light source 501 illuminates a mask 506 through a fly eye lens 502, condenser lenses 503, 505 and a mirror 504. A pellicle 507 is provided on the mask 506 to prevent a pattern transfer failure due to adhesion of foreign matters. A mask pattern formed on the mask 506 is projected onto a wafer 509, a substrate to be worked, through a projection lens 508. The mask 506 is placed on a mask stage 518 whose position is controlled by a mask position control means 517, and the mask center and the optical axis of the projection lens 508 are correctly aligned. The wafer 509 is held on a specimen mount 510 by vacuum suction. The specimen mount 510 is put on a Z stage 511, movable in the direction of the axis of the projection lens 508, i.e., in a Z direction, and further mounted on an XY stage 512. The Z stage 511 and the XY stage 512 are driven by their drive means 513, 514, respectively, in response to control commands from a main control system 519, so that the specimen mount 510 can be moved to any desired exposure position. The position of the specimen mount is precisely monitored by a laser measuring device 515 as a position of a mirror 516 fixed to the Z stage 511. The surface position of the wafer 509 is measured by a focus position detection means, which comprises a detection beam generator 520, a detection beam 523 and a beam receiver 521.

Figure 12D:
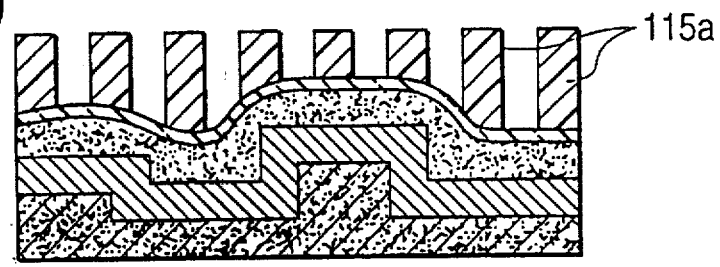
Figure 12E:
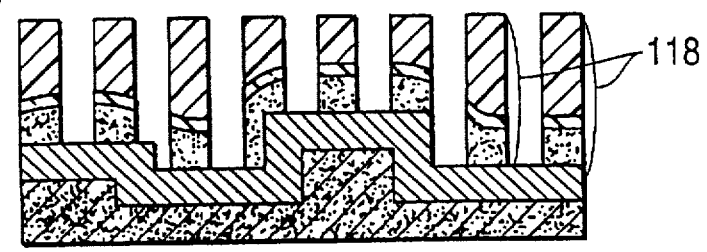

Next, as shown in FIG. 12(d), the resist 115 was developed to form a resist pattern 115a. Then, as shown in FIG. 1(e), with the resist pattern 115a as a mask, the organic film 112 (anti-reflective film) was etched to form over the substrate a resist pattern 118 including a processed anti-reflective film. This anti-reflection method was used to form a 0.35-μm pattern, whose dimensional accuracy was found to be 5%. When a commercially available ARC type anti-reflective film with 0.1-μm thickness was used, the dimensional accuracy was 10%. Increasing the film thickness of ARC posed a problem of dimensional shift and collapse of the resist pattern during etching.

Embodiment 7

Figure 2:
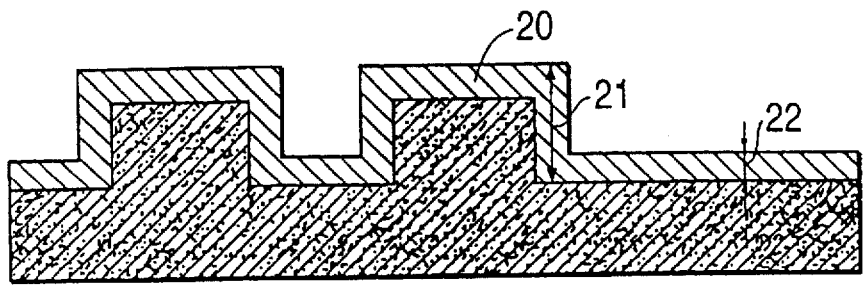
FIG. 2 is a conceptual diagram showing a problem of a conventional (interference anti-reflection) method.
Figure 3:
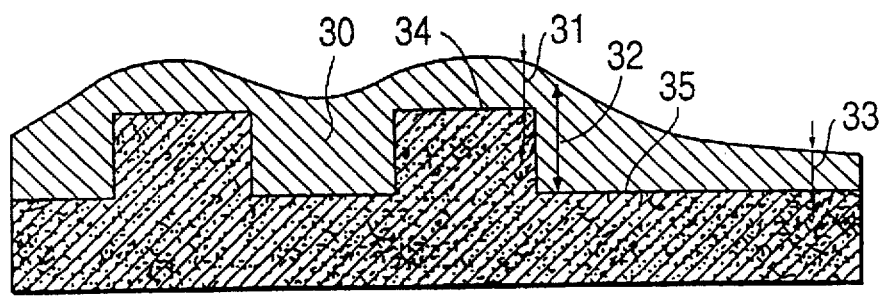
FIG. 3 is a conceptual diagram showing a problem of a conventional (ARC) method.
Figure 4:
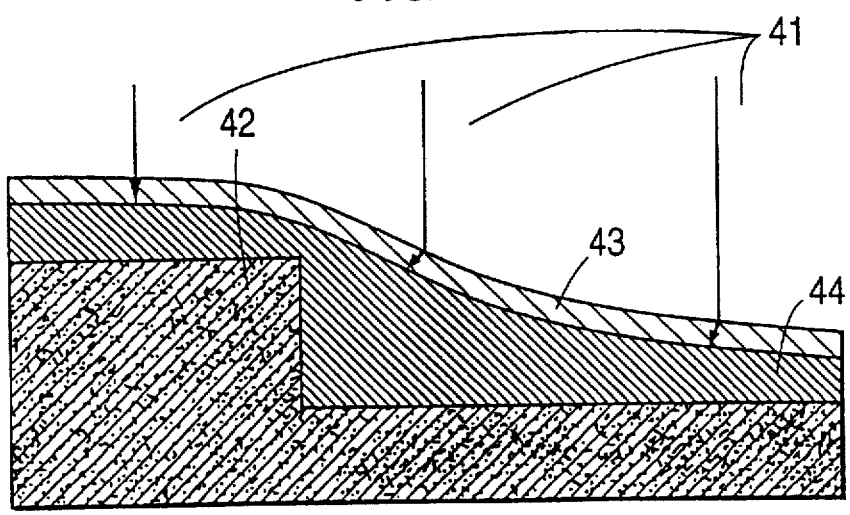
FIG. 4 is a conceptual diagram showing the features of an anti-reflective film of this invention.
Figure 5:
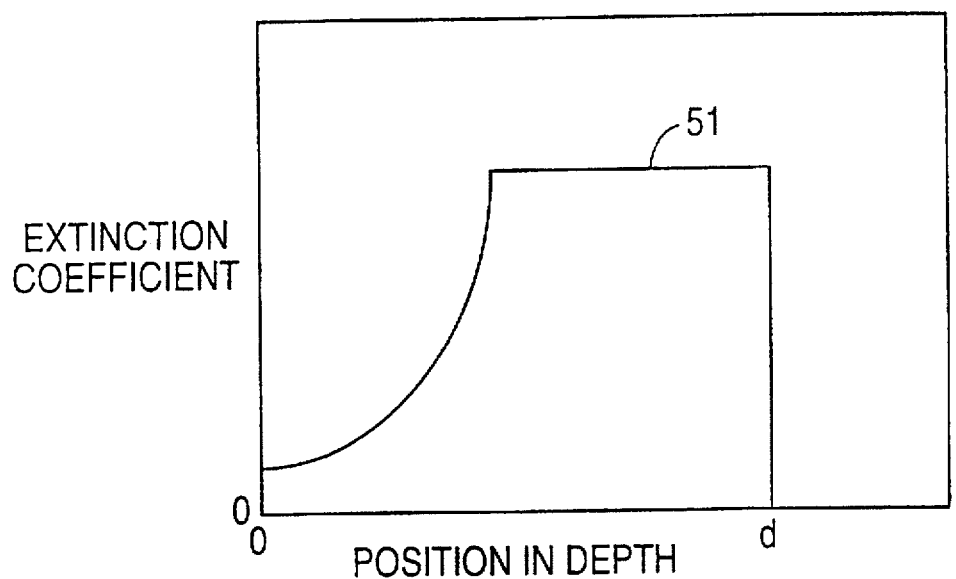
FIG. 5 is a characteristic diagram showing a photoabsorption characteristic in the anti-reflective film of this invention.
Figure 6:
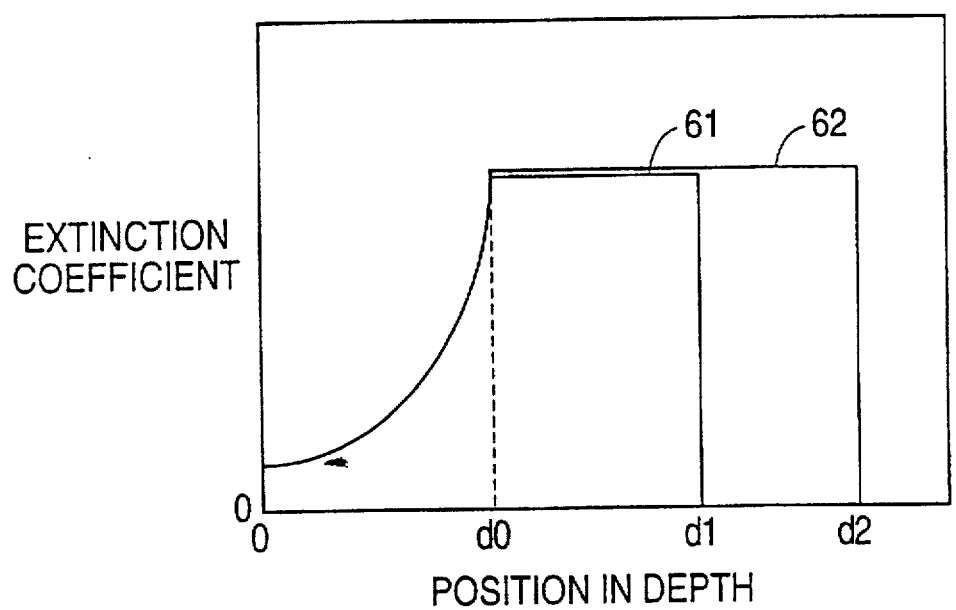
FIG. 6 is a characteristic diagram showing a photoabsorption characteristic in the anti-reflective film of this invention.

A seventh embodiment of this invention is described in the following. First, the substrate is deposited with an organic film and heat-treated at 100° C., as in the sixth embodiment. The thickness of the organic film was set to 0.1 μm over a planar surface. In areas where the organic film was thin due to steps on the substrate surface, the film thickness was 0.06 μm. In thick areas, it was 0.18 μm. Because an h line radiation (wavelength 405 nm) was used for the pattern exposure light, the photoabsorbance change reference depth $\lambda/4n_A$ for prevention of interface reflection was about 0.06 μm, which is not thicker than the thickness of the organic film. The organic film 112 used a nitrone compound, a bleaching photoabsorptive compound. The substrate used is a silicon wafer stacked successively on its surface with an oxide film 5 nm thick, a polysilicon film 0.15 μm thick and an oxide film 0.2 μm thick. The thickness of the oxide films is affected by the steps of the substrate and varies from one location to another, as explained in connection with FIG. 2.

Next, the entire surface was irradiated with an i line radiation. The flood exposure light (photoabsorption modulation light) transformed a surface portion of the organic film into a layer which is transparent at its surface and which has an photoabsorbance level distribution in which the photoabsorbance level increases into the layer in the direction of its thickness. Then, the wafer was exposed to an acid atmosphere, in this case, a hydrogen chloride gas. This treatment transformed the nitrone compound into a non-bleaching substance by light irradiation. That is, the photoabsorption modulation light bleached the organic film to produce a photoabsorbance level distribution, after which the photoabsorbance level distribution was fixed by exposing the film to the acid atmosphere so that the photoabsorbance level distribution would not change when subjected to the pattern exposure light at a later process.

Next, after a resist was applied to the organic film, pattern exposure light was applied to the resist through a mask in a conventional way. The pattern exposure light used a h line radiation as mentioned earlier.

Then, with the resist pattern as a mask, the organic film (anti-reflective film) was etched to form over the substrate a resist pattern including a processed anti-reflective film. This anti-reflection method was used to form a 0.4-μm pattern, whose dimensional accuracy was found to be 5%. When a commercially available ARC type anti-reflective film with 0.1-μm thickness was used, the dimensional accuracy was 10%. Increasing the film thickness of ARC posed a problem of dimensional shift and collapse of the resist pattern during etching.

While this embodiment used a nitrone compound for an organic film, it is possible to use diazonaphthoquinone instead of the nitrone compound for a photoabsorptive compound, and add a base polymer to form an organic film. Alternatively, a mixture of diazonium salt and phenol may be used for an organic film, and alkali vapor or ammonia gas may be used for a bleaching characteristic fixation gas.

Embodiment 8

An eighth embodiment of this invention is described. First, the substrate was deposited with an organic film and heat-treated at 100° C. The thickness of the organic film was set to 0.08 μm over a planar surface. In areas where the organic film was thin due to steps on the substrate surface, the film thickness was 0.05 μm. In thick areas, it was 0.15 μm. Because a KrF excimer laser beam (wavelength 248 nm) was used for the pattern exposure light, the photoabsorbance change reference depth $\lambda/4n_A$, for prevention of interface reflection, was about 0.035 μm, which is thinner than the thickness of the organic film. The organic film was formed of novolac resin containing indenebisazide as an additive. Other aromatic azides than indenebisazide may be used. The substrate used is a silicon wafer with steps, which is deposited with an oxide film 10 nm thick, a tungsten polycide film 0.1 μm thick and further an oxide film 0.15 μm thick.

Next, the entire wafer surface was irradiated with light of a wavelength of 308 nm and then heat-treated at 250° C. Indenebisazide absorbed light of 308 nm and a distribution of indenebisazide that reacted with the light was formed beginning with the surface side. Indenebisazide that did not react will exhibit a strong photoabsorption characteristic for the light of 248 nm, when heat-treated later. Therefore, after the latter heat treatment, a film was formed which strongly absorbs light of 248 nm on the bottom side, and, on the surface side, moderately absorbs this light.

Next, after a resist was deposited on the organic film, the pattern exposure light was applied to the resist through a mask in an ordinary way. As mentioned earlier, the exposure light used a KrF excimer laser beam. Then, the resist was developed according to a conventional procedure to form a resist pattern. With the resist pattern as a mask the organic film (anti-reflective film) was etched to form over the substrate a resist pattern including a processed anti-reflective film. This anti-reflection method was used to form a 0.25-μm pattern, whose dimension accuracy was found to be 5%. When a commercially available ARC type anti-reflective film with 0.1-μm thickness was used, the dimensional accuracy was 8%. Increasing the film thickness of ARC posed a problem of dimensional shift and collapse of the resist pattern during etching. This technology was used to form logic LSI gates, whose dimensional precision was found to be 5%. This technology allowed fabrication of high-speed logic LSIs.

Embodiment 9

Figure 14A:
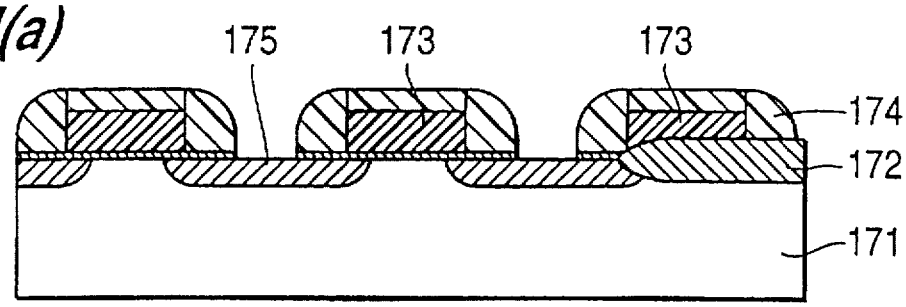
FIGS. 14(a)–(d) are cross sections illustrating the process of manufacturing a semiconductor device of this invention.
Figure 14B:
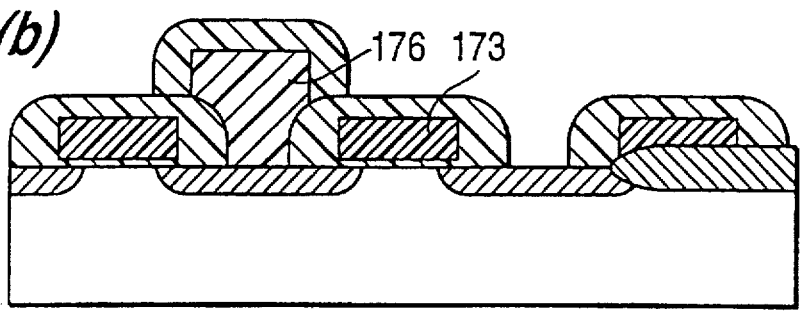
Figure 14C:
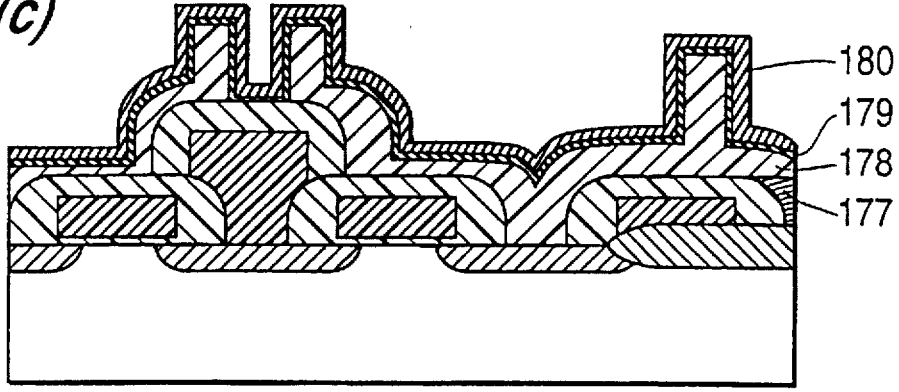
Figure 14D:
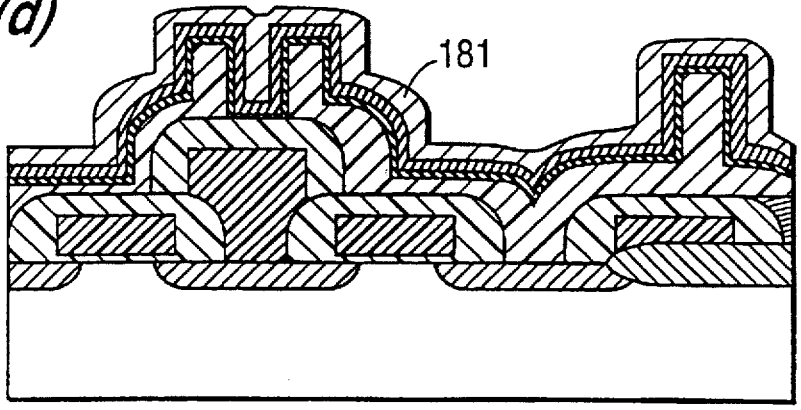

As a ninth embodiment of this invention, a semiconductor memory device is fabricated by using a resist pattern forming method of this invention. FIG. 14 is a cross section of a semiconductor memory device showing a major process of manufacture. As shown in FIG. 14(a), a P-type silicon semiconductor 171 is used as a substrate, on the surface of which is formed a device isolation region 172 by using a known isolation technique. Next, word lines 173 are formed which have a laminated structure of 150 nm of polysilicon and 200 nm of $SiO_2$. Further, 150 nm of $SiO_2$ is deposited by using a chemical vapor deposition method and anisotropically etched to form a side spacer 174 of $SiO_2$ on the side walls of the word line. Next, an n-diffusion layer 175 is formed according to a known process. Then, as shown in FIG. 14(b), a data line 176 is formed according to a known procedure. The data line is made of a polysilicon or a high melting point metal silicide, or stacked films of polysilicon and a high melting point silicide, known in the art. Next, as shown in FIG. 14(c), a SiN film 177 is provided on a side spacer 174 on device isolation region 172, and then a storage node 178 of polysilicon is formed according to a known procedure. After this, the wafer is deposited with $Ta_2O_5$, $Si_3N_4$, $SiO_2$ or ferroelectric, or a composite film of these, to form a capacitor insulating film 179. This is followed by deposition of polysilicon, high melting point metal, high melting point metal silicide, or a low resistance conductor such as Al and Cu, to form a plate electrode 180. Next, as shown in FIG. 14(d), an interconnect 181 is formed according to a known process. Next, the wafer is subjected to a known interconnect layer forming process and a passivation process to form a memory device. Only representative manufacturing processes have been described here. For processes other than shown here, known device manufacture techniques are used. If the order of individual processes differs from what is described above, this invention can still be applied. In the above device manufacture, the method of this invention was employed in almost all processes of lithography. In processes where degradation of dimensional precision due to reflected light does not pose any problem, for example, this invention need not be applied, although it can still be used. This invention was not applied to a via hole forming step in the passivation process or to a pattern forming step for making large ion implantation masks.

Figure 15A:
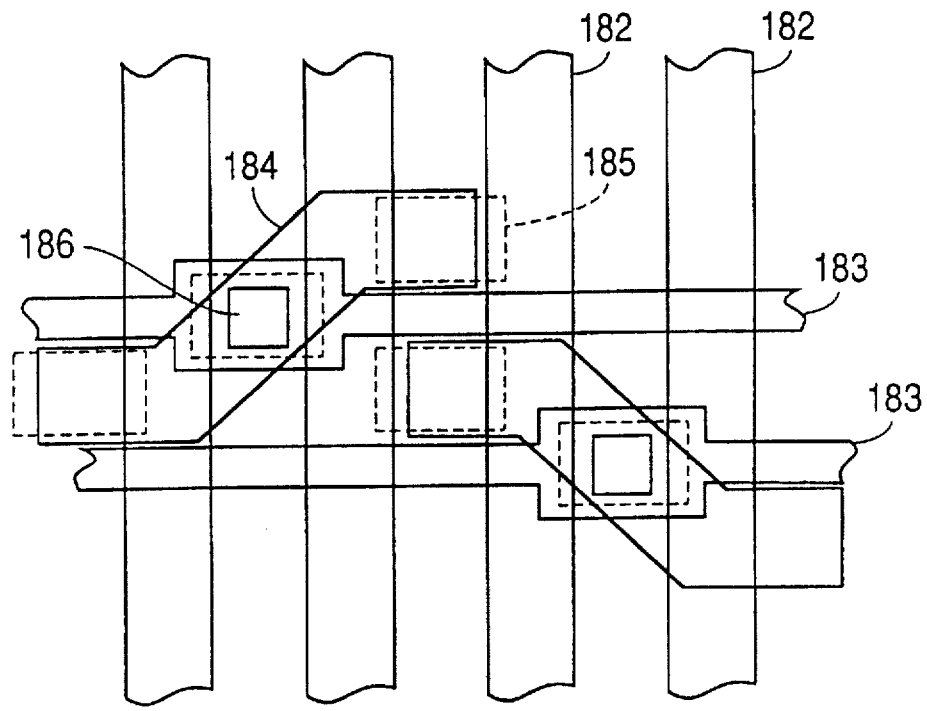
FIGS. 15(a) and (b) are plan views of major patterns forming the semiconductor device of this invention.
Figure 15B:
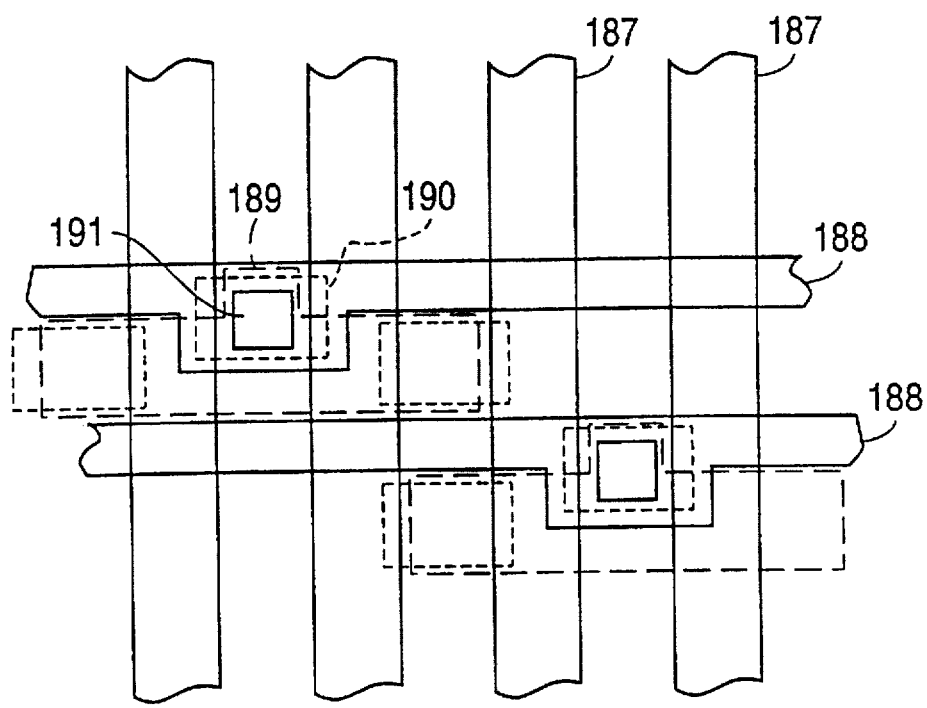

Next, our explanation goes to a pattern formed by lithography. FIGS. 15(a)–(b) show pattern arrangements in a memory section of a representative pattern that forms a memory device. FIG. 15(a) shows one example of a pattern of a first device manufactured. Designated 182 are word lines, 183 data lines, 184 active regions, 185 storage nodes, and 186 patterns of node leadout holes. This invention was applied to a process in the lithography in which precise resolution of microfine patterns is required. In the pattern of FIG. 15(a), this invention was applied to the forming of all patterns.

FIG. 15(b) shows one example of a pattern of a second device manufactured. Denoted 187 are word lines, 188 data lines, 189 active regions, 190 storage nodes, and 191 patterns of node leadout holes. In this example, too, this invention was applied to the forming of all patterns shown here. For the processes other than the pattern-forming process shown here that use the minimum design rule, this invention was applied.

The characteristic of the device manufactured according to this invention was better than those of devices manufactured using conventional methods. To describe in more concrete terms, variations in the width of word lines are small and therefore the speed at which data is read out is high and stable. Because variations in area of the storage nodes are small, data holding characteristics are stable. These characteristic improvements have been realized. The yield of satisfactory products, which was 40% or less in conventional methods, is improved to as high as more than 70%.

While this embodiment describes the case of a memory LSI, logic LSIs have also realized stabilized and enhanced operation speeds and improved yield. The greatest reason behind such a significant improvement is an improved controllability of the gate dimension.

Embodiment 10

Figure 16:
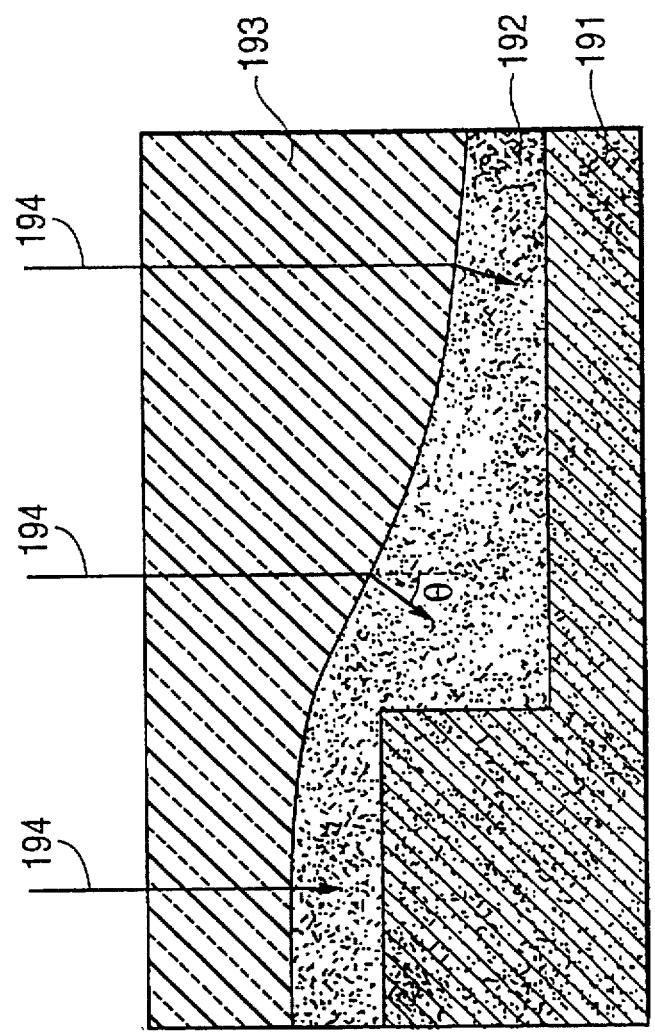
FIG. 16 is a conceptual diagram showing features of the tenth embodiment.

Before the photoabsorption modulation light was irradiated against the organic film in the eighth embodiment, the organic film 192 (see FIG. 16) was coated with a transparent film 193, which has almost the same refractive index as the resist and is transparent to the photoabsorption modulation light. In this embodiment, polyvinylpyrrolidone was used for the transparent film. Through this transparent film the photoabsorption modulation light 194 was applied to the organic film. After the application of this light, the transparent film was removed and the succeeding processes, from the resist application step forward, similar to those of the eighth embodiment, were carried out to form a resist pattern. Polyvinylpyrrolidone was removed by washing with water. If the organic film uses a non water-soluble film, this water cleansing will not cause damage to the organic film, such as degradation and thickness reduction. Because of this process, the refraction angle θ of the photoabsorption modulation light at the interface between the coating film 193 and the organic film 192 agrees with the refraction angle of the pattern exposure light at the interface between the resist and the organic film. That is, this process makes it possible to make equal the photoabsorption distributions in the anti-reflective film in the direction of pattern exposure light propagation even when the substrate step is large. This in turn permits more precise control of light interference in the anti-reflective film, reducing reflection. In this embodiment, the substrate steps or roughness are made 0.1 μm larger than those of the eighth embodiment. Despite the increased surface roughness, the 0.35-μm pattern was able to be formed with an accuracy of 4.5%.

While a transparent coating film was used for the refraction angle θ control in this embodiment, it is also possible to use a liquid instead of a transparent coating film. That is, it is effective to irradiate the photoabsorption modulation light to the wafer via a liquid, for controlling the reflection angle θ. In the case that the refractive index of the liquid to the photoabsorption modulation light is close to the refractive index of the resist to the pattern exposure light, light interference in the anti-reflective film can be controlled more precisely even when the substrate step is large, because the refraction angle of the photoabsorption modulation light at the interface between the liquid and the organic film agrees with the refraction angle of the pattern exposure light at the interface between the resist and organic film. The typical liquid is water and oil. The process using the liquid is simple, because the process does not require coating and removal of the transparent coating film. This is an advantage of the process using the liquid.

Embodiment 11

Figure 17A:
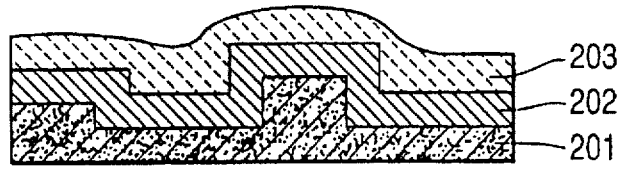
FIGS. 17(a)–(f) are cross sections illustrating an eleventh embodiment of this invention.

The process of this invention is explained by referring to FIGS. 17(a)–(f). First, as shown in FIG. 17(a), a silicon wafer 201 as a substrate with steps is deposited with a tungsten film 202 to a thickness of 0.2 μm and further with an SOG (spin on glass) film 203. In areas where the thickness of the SOG film is thin due to steps of the substrate, the film thickness was 0.2 μm. In thick areas, it was 0.5 μm. The SOG film is transparent to the KrF excimer laser beam (wavelength 248 nm).

Figure 17B:
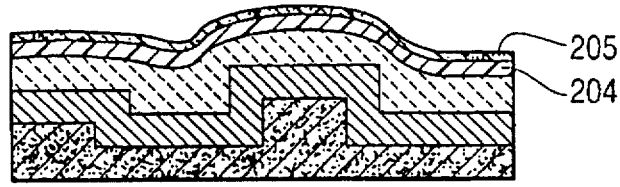

Next, as shown in FIG. 17(b), the SOG film was deposited with a silicon film 204 (light shielding anti-reflective film) to a thickness of 0.025 μm by DC sputtering, with Si as a target and Ar as atmosphere.

For the KrF excimer laser beam, the film's refractive index (real part) was 2.3 and extinction coefficient was 2.8. The transmittivity of this film for the KrF excimer laser beam was 3% or lower (energy ratio). Because the reflected light from the substrate travels forward and then backward in this film and returns to the resist, the film makes a satisfactory light shielding film.

Then, this silicon film was covered with a SiNx film 205 (interference anti-reflective film) to a thickness of 0.025 μm by DC sputtering, with silicon as a target and with $N_2$ and Ar as atmosphere. The gas mixture ratio was adjusted so that the refractive index (real part) and extinction coefficient of the SiNx film for the KrF excimer laser beam were 2.3 and 0.6 respectively.

The film thickness and refractive index are the anti-reflection conditions for the interference film. This SiNx/Si two-layer film kept the reflectivity of the KrF excimer laser beam as the exposure light below 0.01% (energy ratio), almost below the nonreflective level, irrespective of the location (i.e., without being influenced by the SOG film thickness or steps). Because this two-layer film is formed by sputtering, it does not contain components, such as ammonia, that will deteriorate the characteristics of a chemically amplified resist. This widens the selection range of resists for use in the two-layer combination of the film. This is an advantage offered by the sputtering method.

So far, the Si film forming chamber and the SiNx film forming chamber use separate sputtering apparatuses. The use of separate chambers enabled a desired gas mixture ratio to be obtained stably. It is also possible to form two kinds of film with a single chamber. Common use of the chamber of course reduces equipment cost.

Figure 17C:
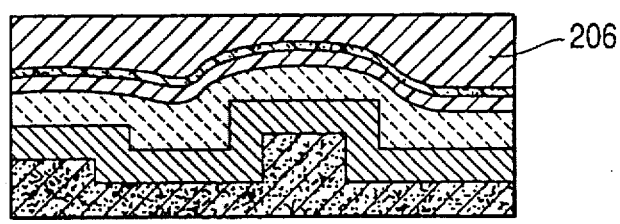
Figure 17D:
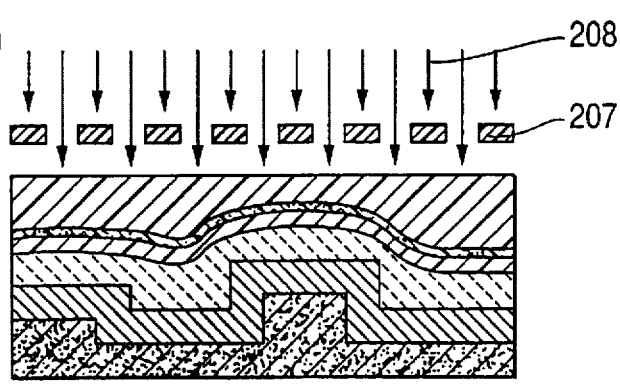

Next, as shown in FIG. 17(c), a resist 206 was deposited over the SiNx film 205. The resist has a refractive index (real part) of 1.8 and extinction coefficient of 0.02, for the KrF excimer laser beam. Then, as shown in FIG. 17(d), exposure light 208 was applied to the resist 206 through a mask 207 according to a conventional procedure. Here, a KrF excimer laser beam was used for the exposure light. Though not shown, this exposure used a stepper with a lens numerical aperture of 0.45. This is only one example of experimental conditions and a proximity exposure method may be used instead.

Figure 17E:
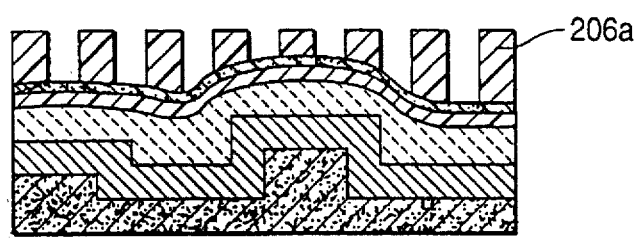
Figure 17F:
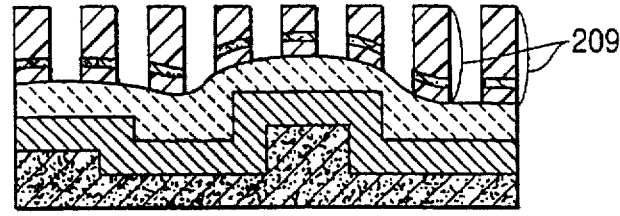
Figure 18:
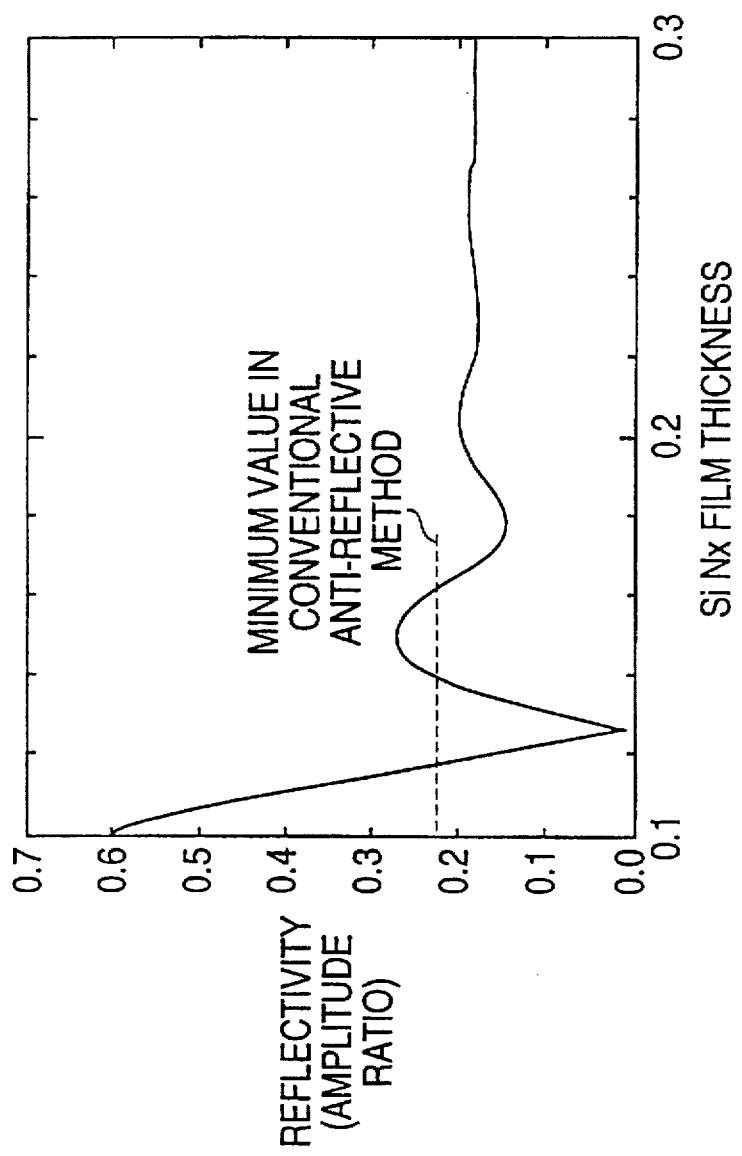
FIG. 18 is a characteristic diagram showing the reflection prevention effect of the eleventh embodiment.

Next, as shown in FIG. 17(e), the resist 206 was developed, in a conventional way, to form a resist pattern 206a. Then, with the resist pattern 206a as a mask, the SiNx anti-reflective film 205 and the silicon film 204 were etched to form over the substrate a resist pattern 209 including a processed anti-reflective film, as shown in FIG. 17(f). This anti-reflection method was used to form a 0.25-μm pattern, whose dimensional accuracy was found to be 5%. When a conventional anti-reflective film with 0.05-μm thickness was used, the dimensional accuracy could not be improved from 10% no matter how much the photoabsorption coefficient was optimized. The pattern detection for alignment was done through this anti-reflective film, and a sufficient pattern detection signal was obtained. This is because the anti-reflective film has a sufficient light shielding capability for the KrF excimer laser beam but has a transmittivity of 95% or more for light whose wavelength is longer than 540 nm, the wavelength of the pattern detection beam. This is one of the features offered by the SiNx/Si two-layer anti-reflective film.

Figure 22:
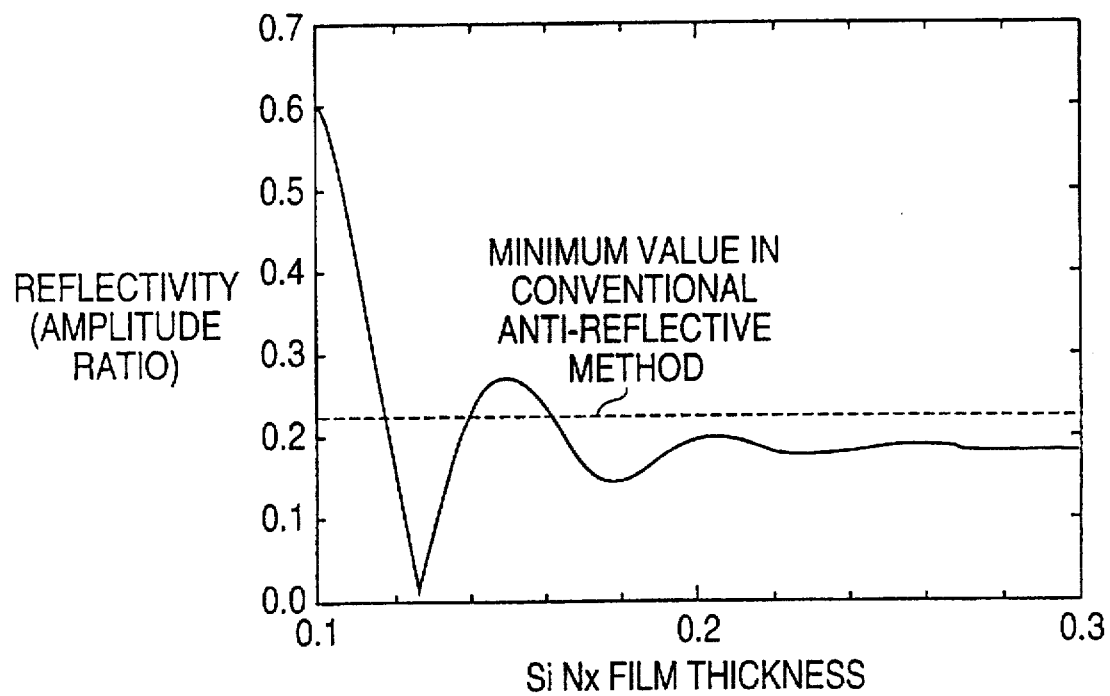
FIG. 22 is a characteristic diagram showing the reflection prevention effect of the sixteenth embodiment.

Although this embodiment shows a case of the silicon film thickness of 0.025 μm, the silicon film can be equal to or greater than this thickness. As can be seen from FIG. 22, which shows the change of reflectivity with the thickness of the SiNx film, a reflection prevention effect greater than that of the conventional anti-reflective film can be obtained by controlling the thickness of the SiNx film in the range between 0.017 and 0.039 μm.

Embodiment 12

Figure 19A:
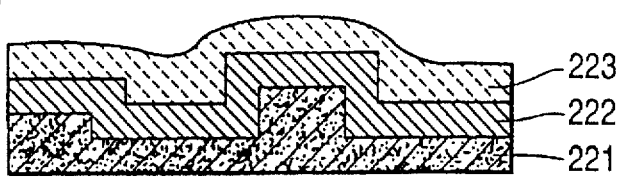
FIGS. 19(a)–(f) are cross sections illustrating a twelfth embodiment of this invention.

A twelfth embodiment of this invention is described by referring to FIGS. 19(a)–(f). First, as shown in FIG. 19(a), a silicon wafer 221 as a substrate with steps was deposited with an aluminum film 222 (containing 2% silicon) to a thickness of 0.3 μm, and then with a PSG (phospho-silicate glass) film 223. In areas where the PSG film was thin due to steps of the substrate, the film thickness was 0.3 μm; and in thick areas it was 0.6 μm. The PSG film is transparent to a KrF excimer laser beam.

Figure 19B:
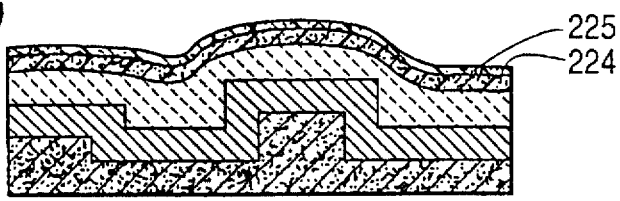

Next, as shown in FIG. 19(b), a SiOxNyHz film 224 was deposited over the PSG film by a plasma CVD method. The SiOxNyHz film was formed by using a gas mixture of silane and nitrous oxide, with the mixture ratio so set that the extinction coefficient for the KrF excimer laser beam was 1.8. The refractive index (real part) at this time was 2.2. The film thickness was set to 0.025 μm. The transmittivity of this film for the KrF excimer beam was 10% or less (energy ratio). Because the reflected light from the substrate passes through this film forward and then backward before returning to the resist, the film makes a satisfactory light shielding film.

Then, the light shielding film 224 was deposited with a SiOxNyHz film 225 to a thickness of 0.027 μm by the plasma CVD method. As with the film 224, the SiOxNyHz film 225 uses a gas mixture of silane and nitrous oxide, but with the mixture ratio so set this time that the extinction coefficient for the KrF excimer laser beam was 0.7. The refractive index (real part) at this time was 2.1. Because this is a CVD film, the film can be deposited to a uniform thickness despite there being steps on the substrate, and thus has high film thickness controllability. This is an advantage of the CVD method.

This two-layer reflection film consisting of the films 224 and 225 kept the reflective index of the KrF excimer beam below 0.02% (energy ratio), almost below the nonreflective level, irrespective of the location.

Figure 19C:
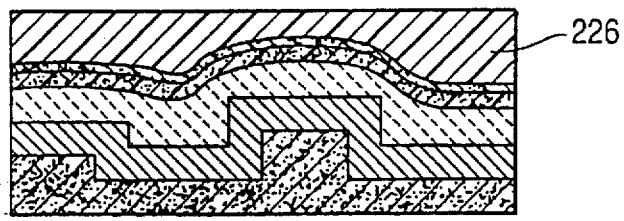
Figure 19D:
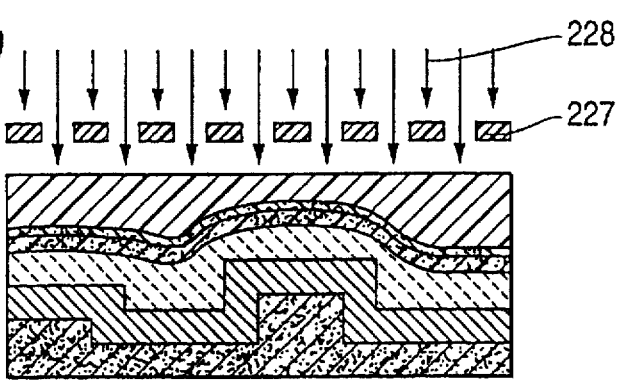

Next, as shown in FIG. 19(c), the SiOxNyHz film 225 was covered with a resist 226, whose refractive index and extinction coefficient for a KrF excimer laser beam were 1.8 and 0.02 respectively. Then exposure light 228 was radiated against the resist 226 through a mask 227 in a conventional way, as shown in FIG. 19(d). The exposure light used a KrF excimer laser beam. Though not shown, this exposure used a stepper with a lens numerical aperture of 0.45. This is only one example of experimental conditions, and a proximity exposure method may be used instead.

Figure 19E:
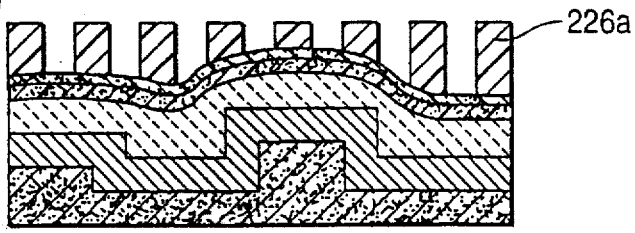
Figure 19F:
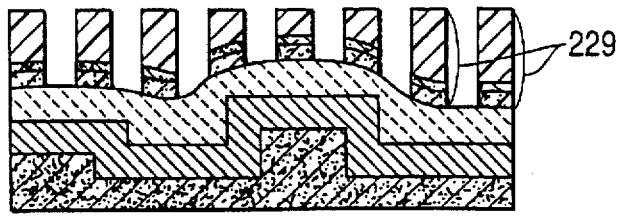

Then, as shown in FIG. 19(e), the resist 226 was developed in a conventional ordinary way to form a resist pattern 226a. Then, as shown in FIG. 19(f), with the resist pattern 226a as a mask, the SiOxNyHz anti-reflective films 224, 225 were etched to form over the substrate a resist pattern 229 including processed anti-reflective films.

This anti-reflection method was used to form a 0.25-µm pattern, whose dimensional accuracy was found to be 5%. When a conventional CVD type anti-reflective film with 0.052-µm thickness was used, the dimensional accuracy could not be improved from 10% no matter how much the photoabsorption coefficient was optimized.

Embodiment 13

Figure 20A:
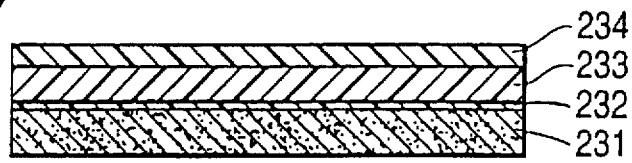
FIGS. 20(a)–(g) are cross sections illustrating a thirteenth embodiment of this invention.

Now, by referring to FIGS. 20(a)–(g), a thirteenth embodiment of this invention is described. As shown in FIG. 20(a), a silicon wafer 231 was deposited with an oxide film 232 (gate oxide film) to a thickness of 4.5 nm, and further with a polysilicon film 233 to a thickness of 0.3 µm. The polysilicon film was diffused with phosphorus to make the polysilicon a conductive film. The polysilicon conductive film was then deposited with an HLD (high temperature low pressure composition) film 234 to a thickness of 0.2 µm. The HLD film was formed at a temperature of 750° C. and at a pressure of 1.5 torr, using a forming gas of (20% silane $(SiH_4)$+80% He), 100 sccm, and $N_2O$, 1300 sccm. Throughout the present disclosure, the HLD film can be, e.g., a silicon oxide film, that, for example, is rich in carbon.

Figure 20B:
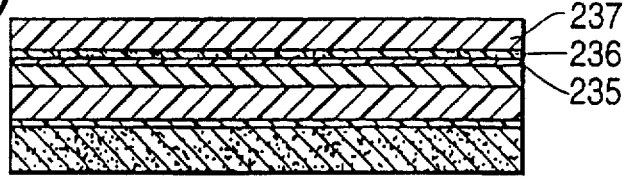

Then, as shown in FIG. 20(b), a silicon film 235 (light shielding film) was deposited over the HLD film 234 to a thickness of 0.025 µm by DC sputtering, with silicon as a target and with Ar as the atmosphere. For the KrF excimer laser beam, this film has a refractive index of 2.3 and the extinction coefficient of 2.8. As with the first embodiment, this film has a transmittivity for the KrF excimer laser beam of 3% or less (energy ratio). Because the reflected light from the substrate passes through this film forward and then backward before returning to the resist, the film makes a satisfactory light shielding film. This silicon film working as a light shielding film may have a greater thickness.

Then, an SiNx film 236 (interference anti-reflective film) was deposited over the silicon film 235 by the DC sputtering method, with silicon as a target and $N_2$ and Ar gases as the atmosphere. As with Embodiment 11, the gas mixture ratio was adjusted so that the refractive index (real part) and extinction coefficient of the SiNx film for the KrF excimer laser beam were 2.3 and 0.6 respectively. A resist 237 was then applied over the SiNx film 236. For the KrF excimer laser beam, the resist 237 has a refractive index (real part) of 1.8 and an extinction coefficient of 0.02.

Figure 20C:
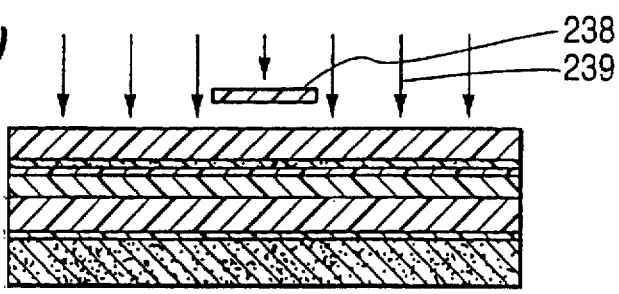

Next, as shown in FIG. 20(c), exposure light 239 was radiated against the resist 237 through a mask 238 in a conventional way. Here, the exposure light used a KrF excimer laser beam. Though not shown, this exposure used a stepper with a lens numerical aperture of 0.45. This is only one example of experimental conditions, and a proximity exposure method may be used instead.

Figure 20D:
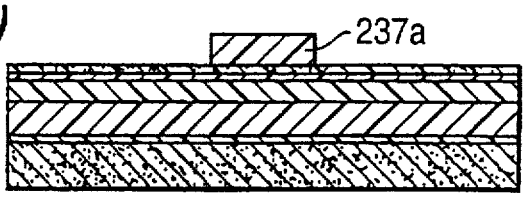
Figure 20E:
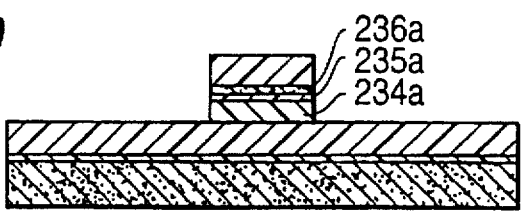
Figure 20F:
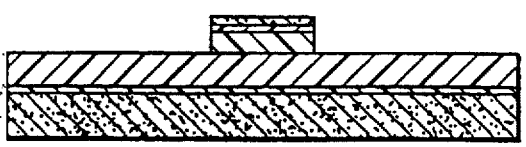

Next, the resist 237 was developed in a conventional way to form a resist pattern 237a, as shown in FIG. 20(d). Then, as shown in FIG. 20(e), with the resist pattern 237a as a mask, the SiNx anti-reflective film 236, silicon film 235 and HLD film 234 were etched to form an SiNx pattern 236a, an Si pattern 235a and an HLD pattern 234a. Then, as shown in FIG. 20(f), the resist pattern 237a was removed in a conventional manner.

Figure 20G:
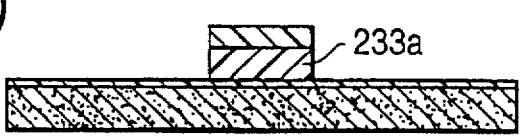

After this, as shown in FIG. 20(g), with the SiNx pattern 236a, Si pattern 235a and HLD pattern 234a as a mask, the polysilicon film 233 was etched to form a gate interconnect pattern 233a. At this time, the Si film 235a and SiNx film 236a that are thin and whose etch rates are little different from that of the polysilicon were removed at the same time during this etching process. The fact that the anti-reflective film can be removed without any special removing process is one of the features of this method. This feature can be obtained not only when the polysilicon gate interconnect film is used but also when a tungsten silicide film, a tungsten polycide film or a stack of these films including polysilicon is used.

This anti-reflection method was used to form a 0.25-µm-wide gate interconnect pattern and its dimensional accuracy was found to be 5%. When a conventional anti-reflective film with 0.05-µm thickness was used, the dimensional accuracy could not be improved from 10% no matter how much the photoabsorption coefficient was optimized.

Embodiment 14

As in the case of Embodiment 11, a silicon wafer as a substrate with steps was deposited with a tungsten film to a thickness of 0.2 µm, and further with an SOG (spin on glass) film. In areas where the SOG film was thin due to steps of the substrate, the film thickness was 0.2 µm; and in thick areas it was 0.5 µm. The SOG film is transparent to a i line radiation (wavelength 365 nm).

Next, the SOG film was deposited with a silicon film (light shielding anti-reflective film) to a thickness of 0.025 µm by a DC sputtering method, with Si as a target and Ar gas as atmosphere. The film's refractive index (real part) and extinction coefficient for the i line radiation was 4.6 and 2.7 respectively. Because the transmittivity of the SOG film for the i line radiation is less than 10% (energy ratio) and the reflected light from the substrate passes this film forward and then backward before returning to the resist, this film makes a good light shielding film.

Then, an SiNx film (interference anti-reflective film) was formed over the silicon film to a thickness of 0.029 µm by a DC sputtering method, with silicon as a target and $N_2$ and Ar gases as atmosphere. The gas mixture ratio was so set that the SiNx film's refractive index (real part) and extinction coefficient for the i line radiation would be 2.8 and 0.4 respectively. The gas mixture ratio (volume) was $Ar/N_2$= 88:12. These film thickness and refractive index constitute the anti-reflection conditions of the interference film. This SiNx/Si two-layer film kept the reflectivity of i line radiation (as the exposure light) below 0.2% (energy ratio), almost below the nonreflective level, irrespective of the location (i.e., without being influenced by SOG film thickness or substrate steps).

Next, a resist was applied over the SiNx film. The resist's refractive index (real part) and extinction coefficient for i line radiation were 1.7 and 0.00 respectively. Exposure light was then radiated against the resist through a mask in an ordinary way. An i line radiation was used for the exposure light. Next, the resist was developed in a conventional way to form a resist pattern.

After this, with the resist pattern as a mask, the SiNx anti-reflective film and the silicon film were etched to form over the substrate a resist pattern including a processed anti-reflective film.

This anti-reflection method was used to form a 0.35-μm pattern and its dimensional accuracy was found to be 5%. When a conventional anti-reflective film with 0.05-μm thickness was used, the dimensional accuracy could not be improved from 15% no matter how much the photoabsorption coefficient was optimized. Although we described a case of 0.029-μm thickness, if the thickness of the SiNx film were able to be increased to 0.1 μm, the reflectivity was further reduced to 0.1% by setting its refractive index to 2.6 and extinction coefficient to 0.2.

Embodiment 15

A silicon wafer as a substrate with steps was deposited with a tungsten film to a thickness of 0.2 μm and further with an HLD film to a thickness of 1 μm. Then, its surface was polished planar by CMP (chemical mechanical polishing). Although the surface was made planar, the thickness of the HLD film varied from one location to another due to the steps of the substrate, ranging from 0.5 μm to 0.75 μm. The HLD film is transparent to i line radiation (wavelength 365 nm).

Next, with silicon as a target and Ar gas as atmosphere, a silicon film (light shielding anti-reflective film) was formed over the HLD film to a thickness of 0.025 μm by a DC sputtering method. This film's refractive index (real part) and extinction coefficient for i line radiation were 4.6 and 2.7 respectively. Because the transmittivity of the silicon film for i line radiation is less than 10% (energy ratio), and the reflected light from the substrate passes this film forward and then backward before returning to the resist, this silicon film makes a good light shielding film.

Then, the silicon film was coated with BARL-i (trade name of an ARC film from Hoechst Co.) to a thickness of 0.06 μm and subjected to an ordinary heat treatment. The extinction coefficient of this BARL-i film for i line radiation was 0.41. The extinction coefficient of the upper-layer anti-reflective film is smaller than that of the lower-layer anti-reflective film. This BARL-i/Si two-layer film kept the reflectivity of i line radiation (as the exposure light) below 1% (energy ratio), almost below the nonreflective level, irrespective of the location.

Next, a resist was applied over the BARL-i film. The resist's refractive index (real part) and extinction coefficient for i line radiation were 1.7 and 0.00 respectively. Then, the resist was irradiated with exposure light through a mask in a normal way. Here, i line radiation was used as the exposure light. The resist was then developed in a conventional manner to form a resist pattern. With the resist pattern as a mask, the BARL-i film and the silicon film were etched to form over the substrate a resist pattern including processed anti-reflective films.

This anti-reflection method was used to form a 0.4-μm pattern and its dimensional accuracy was found to be 5%. With only the BARL-i film 0.06 μm thick, however, the reflectivity of the anti-reflective film was 16%. And the silicon film with a thickness of 0.025 μm alone could only reduce the reflectivity of the anti-reflective film to 40%. That is, the conventional single-layer anti-reflective film could not produce such a reflection prevention effect as this example. With the two-layer anti-reflective film, even when the thickness of the BARL-i film was further reduced to 0.04 μm, the reflectivity was below 10%.

Embodiment 16

Figure 21A:
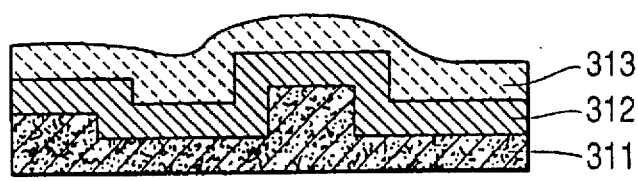
FIGS. 21(a)–(f) are cross sections illustrating a sixteenth embodiment of this invention.

A sixteenth embodiment of this invention is explained by referring to FIGS. 21(a)–(f). As shown in FIG. 21(a), a silicon wafer 311 as a substrate with steps was deposited with a tungsten film 312 to a thickness of 0.2 mm and further with an SOG (spin on glass) film 313. The thickness of the SOG film varied from one location to another due to the steps of the substrate, ranging from 0.2 μm to 0.5 μm. The SOG film is transparent to a KrF excimer laser beam (wavelength 248 nm).

Figure 21B:
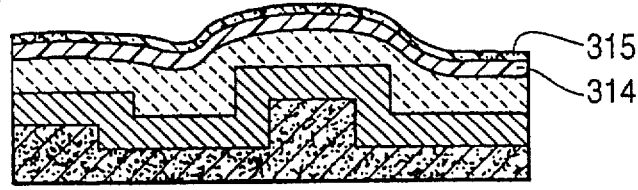

Next, as shown in FIG. 21(b), the SOG film was deposited with a silicon film 314 (reflective film) to a thickness of 0.025 μm by a DC sputtering method, with Si as a target and Ar gas as atmosphere. Although the gas mixture in this example used Ar and $N_2$, other inert gases such as Xe and Kr may be used. The film's refractive index (real part) and extinction coefficient for the KrF excimer laser beam were 2.3 and 2.8 respectively. This film reflects the KrF excimer laser beam by more than 97% (energy ratio). Then, with silicon as a target and $N_2$ and Ar gases as atmosphere, an SiNx film 315 (interference anti-reflective film) was deposited over the silicon film to a thickness of 0.025 μm by a DC sputtering method.

The gas mixture ratio was adjusted so that the SiNx film's refractive index (real part) and extinction coefficient for the KrF excimer laser beam were 2.3 and 0.6 respectively. The film thickness and refractive index constitute the anti-reflection conditions of the interference film.

This SiNx/Si two-layer film kept the reflectivity of the KrF excimer laser beam (as the exposure light) for the resist below 0.01% (energy ratio), almost below the nonreflective level, irrespective of the location (i.e., without being influenced by SOG film thickness or substrate steps). Here, the Si film forming chamber and the SiNx film forming chamber use separate sputtering apparatuses. The use of separate chambers enabled a desired gas mixture ratio to be obtained stably. It is also possible to form two kinds of film with a single chamber. Common use of the chamber of course lowers equipment cost.

Because in this embodiment the film is a sputtered film formed in the atmosphere of $N_2$ and Ar gases, the film does not contain a substance, such as ammonia, that reacts with a chemically amplified resist utilizing an acid catalyst reaction. As reported in the Proceedings of SPIE, 1994, vol. 2195, pp. 422–446, the film was found to have a characteristic that resist pattern geometry flaws (footing or undercutting) were not likely to occur at the substrate interface.

Figure 21C:
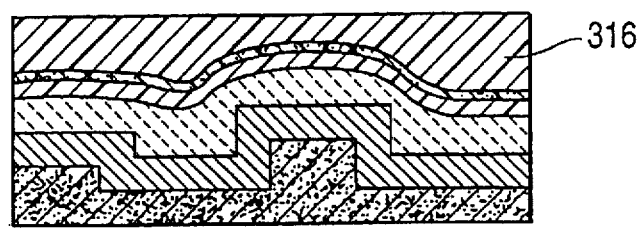
Figure 21D:
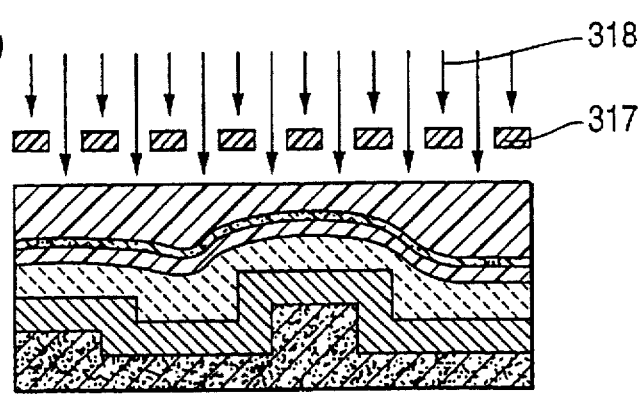

Next, as shown in FIG. 21(c), a resist 316 was applied over the SiNx film 315. The resist's refractive index (real part) and extinction coefficient for the KrF excimer laser beam were 1.8 and 0.02 respectively. Then, as shown in FIG. 21(d), exposure light 318 was radiated against the resist 316 through a mask 317 in a conventional way. A KrF excimer laser beam was used as the exposure light. Though not shown, this exposure used a stepper with a lens numerical aperture of 0.45. This is only one example of experimental conditions, and a proximity exposure method may be used instead.

Figure 21E:
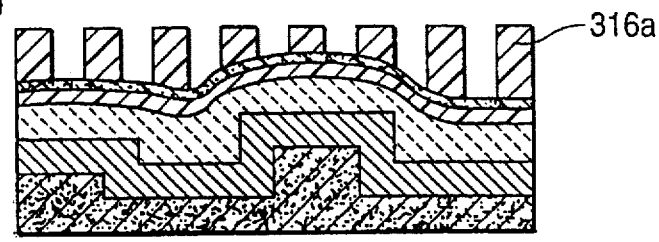
Figure 21F:
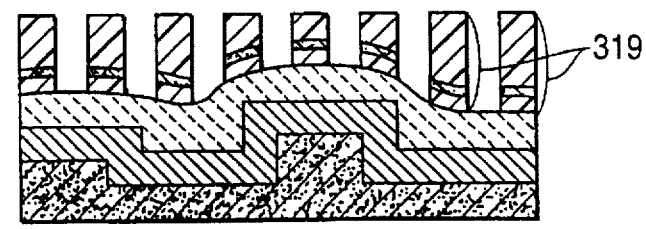

Next, as shown in FIG. 21(e), the resist was developed in an ordinary way to form a resist pattern 316a. Then, as shown in FIG. 21(f), with the resist pattern 316a as a mask, the SiNx anti-reflective film 315 and the silicon film 314 were etched to form over the substrate a resist pattern 319 including a processed anti-reflective film. Because the etched film thickness is as thin as 0.05 μm even where the two films —SiNx anti-reflective film 315 and Si film 314— are combined, no dimensional shift was observed during the etching.

This anti-reflection method was used to form a 0.25-μm pattern, whose dimensional accuracy was found to be 5%. When a conventional anti-reflective film with 0.05-μm thickness was used, the dimensional accuracy could not be improved from 10% no matter how much the photoabsorption coefficient was optimized.

The pattern detection for alignment was done through this anti-reflective film, and a sufficient pattern detection signal was obtained. This is because the anti-reflective film exhibits a sufficient light shielding capability for the KrF excimer laser beam but has a transmittivity of 95% or more for light Whose wavelength is longer than 540 nm, the wavelength of the pattern detection beam. This is one of the features offered by the SiNx/Si two-layer anti-reflective film.

Although we described a case of 0.025-μm thickness, the Si film thickness can be at least this value (i.e., it can be greater than this value). As is evident from FIG. 22, which shows the change of reflectivity of the SiNx film with the film thickness, it is possible to produce a reflection prevention effect greater than that of the conventional anti-reflective film by controlling the thickness of the SiNx film in the 0.017-to-0.039 μm range.

Embodiment 17

Figure 23A:
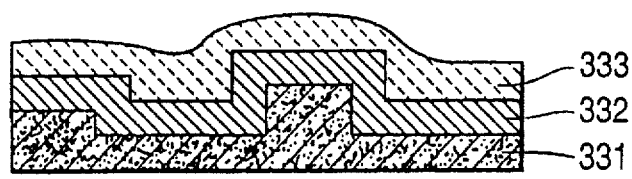
FIGS. 23(a)–(f) are cross sections illustrating a seventeenth embodiment of this invention.

A seventeenth embodiment of this invention is described by referring to FIGS. 23(a)–(f). First, as shown in FIG. 23(a), a silicon wafer 331 as a substrate with steps was deposited with an aluminum film 332 (containing 2% silicon) to a thickness of 0.3 μm and further with a PSG (phospho-silicate glass) film 333. The thickness of the PSG film varied from one location to another due to the steps of the substrate, ranging from 0.3 μm to 0.6 μm. The PSG film is transparent to a KrF excimer laser beam.

Figure 23B:
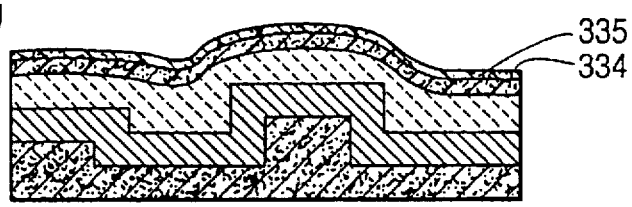

Next, as shown in FIG. 23(b), an SiOxNyHz film 334 was deposited over the PSG film to a thickness of 0.025 μm by a plasma CVD method. The forming of this SiOxNyHz film used a gas mixture of silane and nitrous oxide, and its mixture ratio was set so that the film's extinction coefficient for the KrF excimer laser beam would be 1.8. The film's refractive index (real part) was 2.2. The gas mixture had a volume ratio of silane ($SiH_4$) to nitrous oxide ($N_2O$), $SiH_4/N_2O=2.7$. This film reflects more than 90% (energy ratio) of the KrF excimer laser beam. The SiOxNyHz film as the reflective film exhibited good reflection characteristic also when its thickness was greater than that of this example.

After this, an SiOxNyHz film 335 was deposited over the reflective film 334 to a thickness of 0.027 μm, by a plasma CVD method. The forming of the SiOxNyHz film used a gas mixture of silane and nitrous oxide as with the film 334, but at a mixture ratio such that the extinction coefficient for the KrF excimer laser beam would be 0.7. The refractive index (real part) at this time was 2.1. The mixture ratio of $SiH_4/N_2O=1.5$. Because this is a CVD film, the film can be deposited to a uniform thickness despite there being steps on the substrate, and thus has high film thickness controllability. This is an advantage of the CVD method.

This two-layer film consisting of the films 334 and 335 kept the reflectivity of the KrF excimer laser beam for the resist below 0.02% (energy ratio), almost below the nonreflective level, irrespective of the location.

Figure 23C:
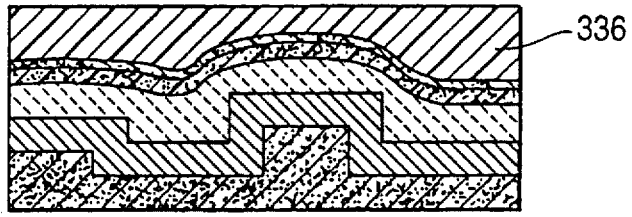
Figure 23D:
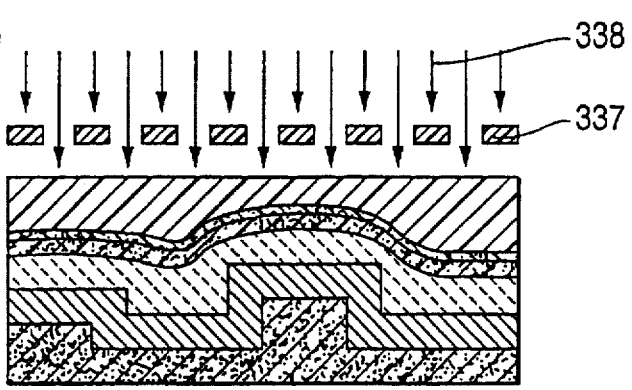

Next, as shown in FIG. 23(c), a resist 336 was deposited over the SiOxNyHz film 335. The resist's refractive index and extinction coefficient for the KrF excimer laser beam were 1.8 and 0.02 respectively. Then, as shown in FIG. 23(d), exposure light 338 was radiated against the resist 336 through a mask 337 in a conventional way. A KrF excimer laser beam was used for the exposure light. Though not shown, this exposure used a stepper with a lens numerical aperture of 0.45. This is only one example of experimental conditions, and a proximity exposure method may be used instead.

Figure 23E:
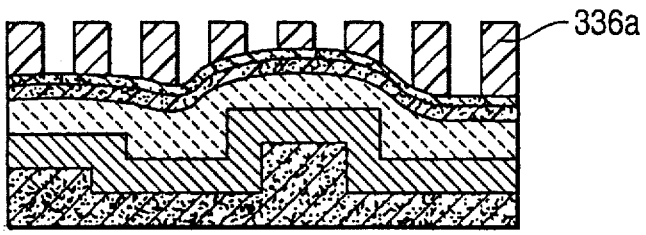
Figure 23F:
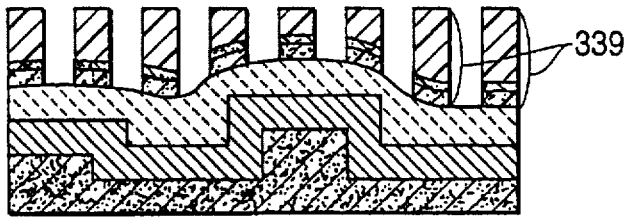

Then, as shown in FIG. 23(e), the resist 336 was developed according to a conventional procedure to form a resist pattern 336a. Then, as shown in FIG. 23(f), with the resist pattern 336a as a mask, the SiOxNyHz anti-reflective films 334, 335 were etched to form over the substrate a resist pattern 339 including processed anti-reflective films.

This anti-reflection method was used to form a 0.25-μm pattern, those dimensional accuracy was found to be 5%. When a conventional CVD type anti-reflective film with 0.052-μm thickness was used, the dimensional accuracy could not be improved from 10% no matter how much the photoabsorption coefficient was optimized. Depositing an $SiO_2$ or SiNx film over the CVD film 335 to a thickness of several nm by sputtering prevents anomalies of a chemically amplified resist geometry at the interface with the substrate, as in the case of Embodiment 16.

Embodiment 18

Figure 24A:
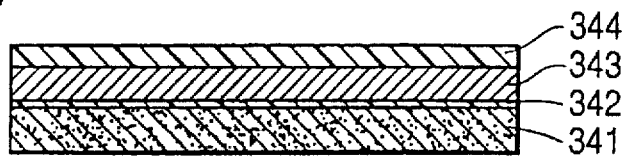
FIGS. 24(a)–(g) are cross sections illustrating an eighteenth embodiment of this invention.
Figure 24B:
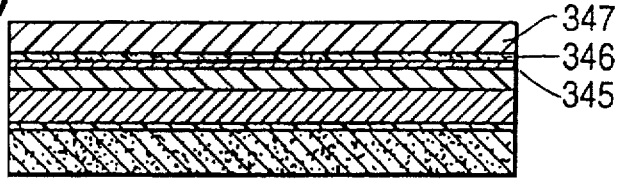

An embodiment of this invention is described by referring to FIGS. 24(a)–(g). First, as shown in FIG. 24(a), a silicon wafer 341 was deposited with an oxide film 342 (gate oxide film) to a thickness of 4.5 nm, and further with a tungsten film 343 to a thickness of 0.2 μm. On the top of the tungsten film was formed an HLD (high temperature low pressure decomposition) film 344 to a thickness of 0.2 μm. Then, as shown in FIG. 24(b), the HLD film 344 was coated with a tungsten film 345 (reflective film) to a thickness of 0.02 μm. This film's refractive index and extinction coefficient for a KrF excimer laser beam were 3.40 and 2.85 respectively. This film reflects more than 94% (energy ratio) of the KrF excimer laser beam. The tungsten film as the reflective film exhibited good reflection characteristics also when its thickness was greater than that of this example.

After this, an SiNx film (interference anti-reflective film) 346 was deposited over the tungsten film 345 to a thickness of 0.028 μm by an RF sputtering method, with Si as a target and $N_2$ and Ar gases as atmosphere. The gas mixture ratio was adjusted so that the SiNx film's refractive index (real part) and extinction coefficient for the KrF excimer laser beam were 2.3 and 0.6 respectively. Then, a resist 347 was applied over the SiNx film 346. The resist's refractive index (real part) and extinction coefficient for the KrF excimer laser beam were 1.8 and 0.02 respectively.

Figure 24C:
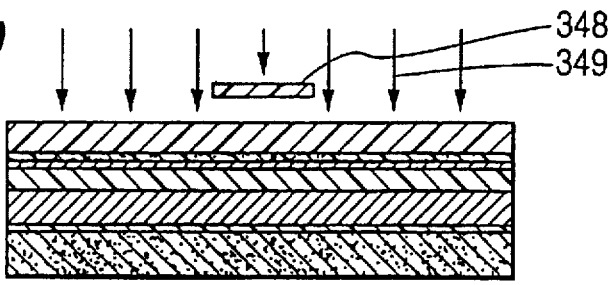

Next, as shown in FIG. 24(c), exposure light 349 was radiated against the resist 347 through a mask 348 in a conventional manner. An KrF excimer laser beam was used for the exposure light. Though not shown, this exposure used a stepper with a lens numerical aperture of 0.45. This is only one example of experimental conditions, and a proximity exposure method may be used instead.

Figure 24D:
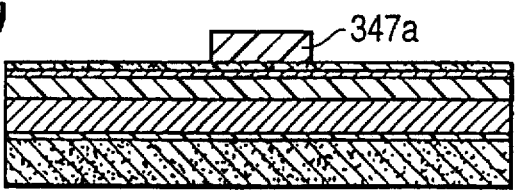
Figure 24E:
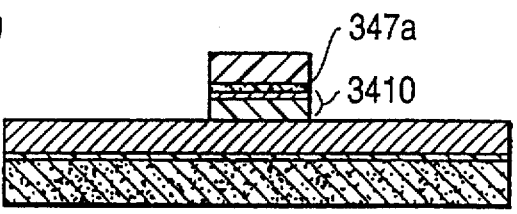

Next, as shown in FIG. 24(d), the resist 347 was developed in a known way to form a resist pattern 347a. Then, as shown in FIG. 24(e), with the resist pattern 347a as a mask, the SiNx anti-reflective film 346, the tungsten anti-reflective film 345 and the HLD film 344 were etched to form a pattern 3410 consisting of SiNx, tungsten reflective film and HLD. The etching rate at this time was 3 for SiNx, 1.3 for the tungsten reflective film, and 3 for the HLD film, compared with 1 for resist.

Figure 24F:
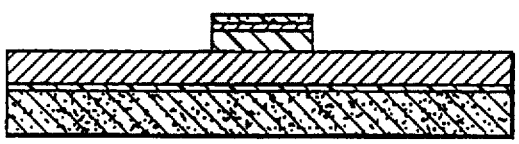
Figure 24G:
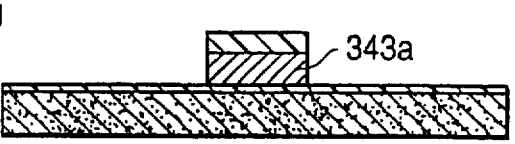

Then, as shown in FIG. 24(f), the resist pattern 347a was removed in a normal way. After this, as shown in FIG. 24(g), with the pattern 3410 consisting of SiNx, W reflective film and HLD as a mask, the tungsten film 343 was etched by using an SF$_6$ gas to form a gate interconnect pattern 343a. The ratio of etching rates at this time was 1:1.2:1 tungsten film, SiNx and HLD film. Hence, the thin tungsten reflective film and SiNx interference anti-reflective film were removed simultaneously with this etching. The etching apparatus used a microwave etching apparatus. This, however, is only one experimental condition, and other etching conditions may be used. While we used an SF$_6$ gas for the etching gas, other etching gases, such as CF$_4$ and NF$_3$, may also be used.

The ability to remove this anti-reflective film without requiring a special removing process is one of the features of this method. This feature can be obtained not only when a tungsten gate interconnect film is used, but also when a tungsten silicide film, a tungsten polycide film or a stack of these films including polysilicon is used. This anti-reflection method was used to form a 0.25-μm-wide gate interconnect pattern, and its dimensional accuracy was found to be 5%. When a conventional anti-reflective film with 0.05-μm thickness was used, the dimensional accuracy could not be improved from 10% no matter how much the photoabsorption coefficient was optimized.

Embodiment 19

A wafer with steps having gates formed thereon was deposited with an SOG film (interlayer insulating film and planarized film) to a thickness of 0.3 μm and further with an aluminum film (containing 2% silicon) to a thickness of 0.4 μm. On top of it, an HLD (high temperature low pressure decomposition) film was formed to a thickness of 0.2 μm. After this, the HLD film was coated with an aluminum film (reflective film) to a thickness of 0.04 μm. The aluminum film's refractive index (real part) and extinction coefficient for a KrF excimer laser beam were 0.19 and 2.94 respectively. This film reflects more than 99% (energy ratio) of the KrF excimer laser beam. The aluminum film as the reflective film exhibited good reflection characteristics for greater thicknesses, also.

Then, an SiOxNyHz film was deposited over this aluminum film to a thickness of 0.019 μm by a plasma CVD method. The forming of the SiOxNyHz film used a gas mixture of silane and nitrous oxide. The gas mixture ratio was set so that the film's extinction coefficient for the KrF excimer laser beam would be 0.9. The refractive index (real part) at this time was 2.48. Because this is a CVD film, the film can be deposited to a uniform thickness despite there being steps on the substrate, and thus has high film thickness controllability. This is an advantage of the CVD method.

After this, a resist was applied over the SiOxNyHz film. The resist's refractive index (real part) and extinction coefficient for the KrF excimer laser beam were 1.8 and 0.02 respectively. Next, the resist was irradiated with exposure light through a mask in a conventional way. An KrF excimer laser beam was used for the exposure light. This exposure used a stepper with a lens numerical aperture of 0.45. This is only one example of experimental conditions, and a proximity exposure method may be used instead. The resist was then developed in a conventional way to form a resist pattern.

Then, with the resist pattern as a mask, the SiOxNyHz anti-reflective film, the aluminum reflective film and the HLD film were etched to form a pattern consisting of SiOxNyHz, aluminum and HLD. After this, the resist pattern was removed according to a known procedure. This was followed by the 0.4-μm thick aluminum film being etched, with the pattern of SiOxNyHz, aluminum and HLD used as a mask, to form an aluminum interconnect pattern. At this time, the thin aluminum anti-reflective film and SiOxNyHz interference anti-reflective film were removed simultaneously with this etching. The ability to remove this anti-reflective film without requiring a special removing process is one of the features of this method.

These reflection prevention effects can be obtained not only when the aluminum gate interconnect film is used, but also when a Ti film, Ta film or Pt film is used. This anti-reflection method was used to form a 0.25-μm-wide interconnect pattern and its dimensional accuracy was found to be 5%. When a conventional anti-reflective film with 0.05-μm thickness was used, the dimensional accuracy could not be improved from 10% no matter how much the photoabsorption coefficient was optimized.

Embodiment 20

A silicon wafer as a substrate with steps was deposited with an aluminum film to a thickness of 0.2 μm, as in the case of Embodiment 16, and further with an SOG (spin on glass) film. The thickness of the SOG film varied according to location due to the steps of the substrate, ranging from 0.2 μm to 0.5 μm. The SOG film was transparent to a KrF excimer laser.beam (wave length 248 nm). Next, the SOG film was coated with an aluminum film (reflective film) to a thickness of 0.041 μm. The aluminum film's refractive index (real part) and extinction coefficient for the KrF excimer laser beam were 0.19 and 2.94 respectively. Then, this aluminum film was deposited with an SiNx film (interference anti-reflective film) to a thickness of 0.019 μm by a DC sputtering method, with silicon as a target and N$_2$ and Ar gases as atmosphere. Here, the gas mixture ratio was adjusted so that the SiNx film's refractive index (real part) and extinction coefficient for the KrF excimer laser beam would be 2.48 and 0.9 respectively. The film thickness and the refractive index constitute the reflection prevention condition for the interference film.

This SiNx/Al two-layer film kept the reflectivity of the KrF excimer laser beam (as the exposure light) for the resist below 0.01% (energy ratio), almost below the nonreflective level, irrespective of the location (i.e., without being influenced by the SOG film thickness or the steps of the substrate). Next, a resist was deposited over the SiNx film. The resist's refractive index (real part) and extinction coefficient for the KrF excimer beam were 1.8 and 0.02 respectively. Then, exposure light was radiated against the resist through a mask in a conventional way. A KrF excimer laser beam was used for the exposure light. This exposure used a stepper with a lens numerical aperture of 0.45. This is only one example of experimental conditions, and a proximity exposure method may be used instead.

Figure 25:
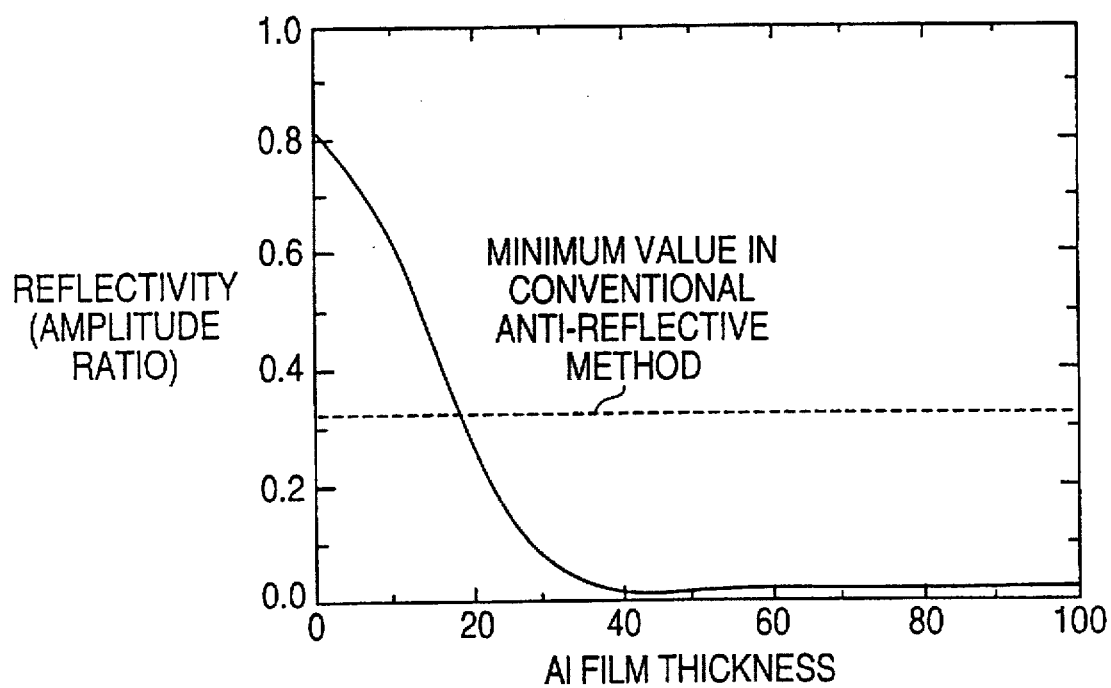
FIG. 25 is a characteristic diagram showing the reflection prevention effect of a twentieth embodiment.

Then, the resist was developed according to a conventional procedure to form a resist pattern. Then, with the resist pattern as a mask, the SiNx anti-reflective film and the aluminum film were etched to form over the substrate a resist pattern including a processed anti-reflective film. This anti-reflection method was used to form a 0.25-μm pattern, whose dimensional accuracy was found to be 5%. On the other hand, as is evident from FIG. 25, which shows the change of reflectivity of the aluminum film with the film thickness, it is possible to produce a sufficient reflection prevention effect when the aluminum film thickness is equal to or greater than 0.04 μm.

When a conventional anti-reflective film with 0.06-μm thickness was used, the dimensional accuracy could not be improved from 10% no matter how much the photoabsorption coefficient was optimized. Pt was able to be used instead of the aluminum reflective film.

Embodiment 21

A silicon wafer as a substrate with steps was deposited with a tungsten film (containing 2% silicon) to a thickness of 0.3 μm, as in the case of Embodiment 16, and further with a PSG (phosphosilicate glass) film. The thickness of the PSG film varied according to location due to the steps of the substrate, ranging from 0.3 μm to 0.6 μm. The PSG film was transparent to a KrF excimer laser beam. Next, the PSG film was coated with a tungsten film to a thickness of 0.02 μm. The tungsten film's refractive index (real part) and extinction coefficient for the KrF excimer laser beam were 3.4 and 2.85 respectively. The reflectivity of this film for the KrF excimer beam was more than 94% (energy ratio).

Then, this tungsten film was deposited with an SiOxNyHz film to a thickness of 0.034 μm by a plasma CVD method. The forming of the SiOxNyHz film used a gas mixture of silane and nitrous oxide with a mixture ratio so set that the film's extinction coefficient would be 0.6. The refractive index (real part) at this time was 2.08. Because this is a CVD film, the film can be deposited to a uniform thickness despite there being steps on the substrate, and thus has high film thickness controllability. This is an advantage of the CVD method. This SiOxNyHz/W two-layer film kept the reflectivity of the KrF excimer laser beam for the resist below 0.01% (energy ratio), almost below the nonreflective level, irrespective of the location.

Next, a resist was deposited over the SiOxNyHz film. The resist's refractive index and extinction coefficient for the KrF excimer laser beam were 1.8 and 0.02 respectively. Then, exposure light was radiated against the resist through a mask in a conventional way. A KrF excimer laser beam was used for the exposure light. This exposure used a stepper with a lens numerical aperture of 0.45. This is only one example of experimental conditions, and a proximity exposure method may be used instead.

Then, the resist was developed according to a conventional procedure to form a resist pattern. Then, with the resist pattern as a mask, the SiOxNyHz anti-reflective film was etched to form over the substrate a resist pattern including a processed anti-reflective film. This anti-reflection method was used to form a 0.25-μm pattern, whose dimensional accuracy was found to be 5%. On the other hand, when a conventional CVD type anti-reflective film with 0.054-μm thickness was used, the dimensional accuracy could not be improved from 10% no matter how much the photoabsorption coefficient was optimized.

Embodiment 22

A silicon wafer as a substrate with steps was deposited with a tungsten film to a thickness of 0.2 μm, as in the case of Embodiment 16, and further with an SOG (spin on glass) film. The thickness of the SOG film varied according to location due to the steps of the substrate, ranging from 0.2 μm to 0.5 μm. The SOG film was transparent to i line radiation (wavelength 365 nm). Next, the SOG film was coated with a silicon film (reflective film) to a thickness of 0.025 μm by a DC sputtering method, with Si as a target and Ar gas as atmosphere. The silicon film's refractive index (real part) and extinction coefficient for i line radiation were 4.6 and 2.7 respectively. The reflectivity of this film for i line radiation was more than 95% (energy ratio).

Then, this silicon film was deposited with an SiNx film (interference anti-reflective film) to a thickness of 0.029 μm by a DC sputtering method, with Si as a target and N$_2$ and Ar gases as atmosphere. The gas mixture ratio was adjusted so that the SiNx film's refractive index (real part) and extinction coefficient for i line radiation were 2.8 and 0.4 respectively. The film thickness and the refractive index constitute the reflection prevention conditions for the interference film. This SiNx/Si two-layer film kept the reflectivity of i line radiation for the resist below 0.2% (energy ratio), almost below the nonreflective level, irrespective of the location (i.e., without being influenced by the SOG film thickness or the steps of the substrate).

Next, a resist was deposited over the SiNx film. The resist's refractive index and extinction coefficient for i line radiation were 1.7 and 0.00 respectively. Then, exposure light was radiated against the resist through a mask in a conventional way. The i line radiation was used for the exposure light. Then, the resist was developed in a conventional way to form a resist pattern.

After this, with the resist pattern as a mask, the SiNx anti-reflective film and the Si film were etched to form over the substrate a resist pattern including a processed anti-reflective film. This anti-reflection method was used to form a 0.35-μm pattern, whose dimensional accuracy was found to be 5%. On the other hand, when a conventional anti-reflective film with 0.05-μm thickness was used, the dimensional accuracy could not be improved from 15% no matter how much the photoabsorption coefficient was optimized. Although the case of 0.029-μm thickness was described here, if the SiNx film thickness could be increased to 0.1 μm, the reflectivity was able to be further reduced to 0.1% by setting the refractive index to 2.6 and the extinction coefficient to 0.2.

Embodiment 23

Figure 26A:
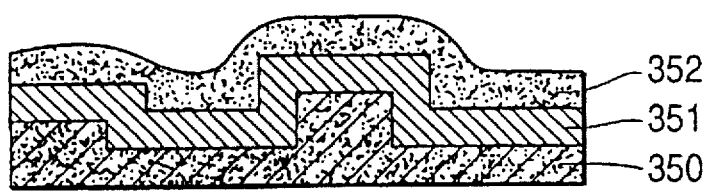
FIGS. 26(a)–(e) are cross sections illustrating a twenty-third embodiment of this invention.

A twenty-third embodiment of this invention is described by referring to FIGS. 26(a)–(e). First, the substrate is deposited with an organic film 352 and heat-treated at 150° C., as shown in FIG. 26(a). The film thickness was set to 0.15 μm over a planar surface. In areas where the film was thin due to steps on the substrate surface, the film thickness was 0.08 μm. In thick areas, it was 0.23 μm. Methyl methacrylate-9-Anthylmethylmethacrylate copolymer was used as the organic film 352. The polymer has a bleaching characteristic. As a substrate, a silicon wafer 350 having steps and deposited with tungsten 351 to a thickness of 0.2 μm was used.

Figure 26B:
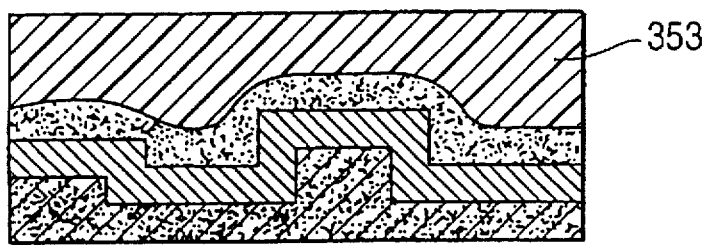

Next, as shown in FIG. 26(b), a resist 353 was spun onto the organic film 352 in a conventional manner, and was baked.

Figure 26C:
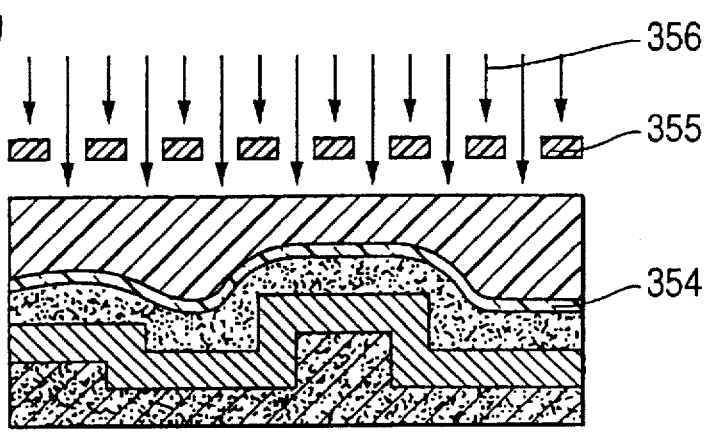

Then as shown in FIG. 26(c), exposure light 356 was applied to the resist 353 through a mask 355, according to a known procedure. A KrF excimer laser beam was used for the exposure light. While the mask is shown close to the film, it is possible to perform exposure through a lens or mirror.

The pattern exposure light reached the organic film 352, the upper surface side of the organic film 352 was bleached, and a relatively highly transparent layer 354 to the exposure light was formed in the upper surface of the organic film. By the process, an anti-reflective film whose exposure light absorbance is greater on the substrate surface side than on the resist surface side is formed automatically.

Figure 26D:
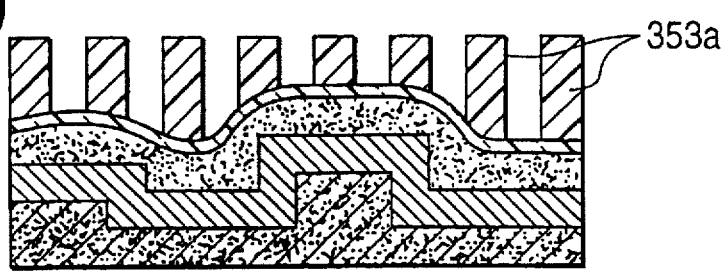
Figure 26E:
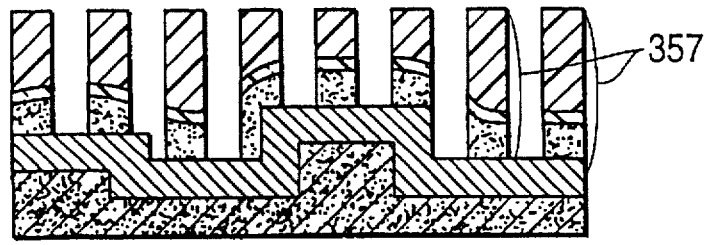

Next, as shown in FIG. 26(d), the resist 353 was developed to form a resist pattern 353. Then, as shown in FIG. 26(e), with the resist pattern 353a as a mask, the organic film (anti-reflective film) was etched to form over the substrate a resist pattern 357 including a processed anti-reflective film. This anti-reflective method was used to form a 0.25 μm pattern, whose dimensional accuracy was found to be 5%. When a commercially available ARC type anti-reflective film with 0.15-μm thickness was used, the dimensional accuracy was 8%. Increasing the film thickness of ARC posed a problem of dimensional shift and collapse of the resist pattern during etching.

This method makes it possible to automatically form the photoabsorbance distribution in an anti-reflective film without any additional procedure. Therefore, this method is simple and is effective to reduce the cost. This is an advantage of this method.

A very high reflection prevention effect can be produced for a variety of kinds of substrates, including those having transparent films and those having high reflectivity like metallic films, without posing any problem, such as aspect ratios, during the process of forming anti-reflective films. This method can form fine and precise resist patterns and therefore improve the yield and reliability of devices to be manufactured. When applied to logic LSIs, this invention enables them to be manufactured at high dimensional precision and increases their operation speeds.

While we have shown and described several embodiments in accordance with the present invention, it is understood that the same is not limited thereto, but is susceptible to numerous changes and modifications as is known in the art; and we therefore do not wish to be limited to the details shown and described herein, but intend to cover all such modifications as are encompassed by the scope of the appended claims.

What is claimed is:

1. A resist pattern forming method, comprising the steps of:
   forming an anti-reflective film over a substrate, said substrate including a transparent film on a body, the transparent film being transparent to exposure light;
   forming a resist film over the anti-reflective film, the anti-reflective film having a thickness in a direction between the substrate and the resist film;
   exposing a pattern onto the resist film using the exposure light, to form an exposed resist film; and
   developing the exposed resist film to form a resist pattern;
   wherein the anti-reflective film is formed on the transparent film, and
   wherein an extinction coefficient of the anti-reflective film for the exposure light varies in a direction of the anti-reflective film thickness.

2. A resist pattern forming method according to claim 1, wherein the extinction coefficient of the anti-reflective film increases from a side closest to the resist film to a side closest to the substrate, in the direction of the anti-reflective film thickness.

3. A resist pattern forming method according to claim 1, wherein said substrate has a stepped portion, said anti-reflective film and said resist film being provided over said stepped portion.

4. A resist pattern forming method according to claim 1, wherein said substrate has an uneven surface.

5. A resist pattern forming method, comprising the steps of:
   forming an anti-reflective film over a substrate;
   forming a resist film over the anti-reflective film;
   exposing a pattern onto the resist film using an exposure light, so as to form an exposed resist film; and
   developing the exposed resist film to form a resist pattern;
   wherein the anti-reflective film has an extinction coefficient for the exposure light which is greater on a side closest to the substrate than on a side closest to the resist film.

6. A resist pattern forming method according to claim 5, wherein the extinction coefficient of the anti-reflective film continuously increases from the side closest to the resist film toward the side closest to the substrate.

7. A resist pattern forming method according to claim 6, wherein the anti-reflective film is formed by forming an anti-reflective layer and, prior to forming the resist film, exposing the surface of the anti-reflective layer to a chemical which is a liquid or gas, to diffuse the chemical into the anti-reflective layer.

8. A resist pattern forming method according to claim 7, wherein a material of the anti-reflective film contains a nitrone compound and the chemical contains HCl.

9. A resist pattern forming method according to claim 5, wherein the anti-reflective film has a photoabsorption gradient in a direction from the side closest to the resist film to the side closest to the substrate, the photoabsorption increasing in said direction.

10. A resist pattern forming method according to claim 5, wherein the anti-reflective film has a photoabsorption gradient in a thickness direction thereof, and is formed of a mixing layer that is formed when a resist is applied over the anti-reflective film.

11. A resist pattern forming method according to claim 5, wherein the anti-reflective film has a photoabsorption gradient in a thickness direction thereof, is formed by a chemical vapor deposition (CVD) method, and the photoabsorption gradient is produced by changing film-forming conditions during formation of the anti-reflective film.

12. A resist pattern forming method according to claim 11, wherein the film formed by the CVD method is an $SiO_xN_yH_z$ film, and the photoabsorption gradient is produced by changing the composition of the film by changing x, y and z.

13. A resist pattern forming method according to claim 5, wherein the anti-reflective film has a photoabsorption gradient in a thickness direction thereof, is formed by a sputtering method, and the photoabsorption gradient is produced by changing a composition of an atmosphere in which the sputtering method is performed, during sputtering.

14. A resist pattern forming method according to claim 5, wherein the anti-reflective film has a photoabsorption gradient in a thickness direction thereof, is formed by a sputtering method, with silicon as a target in an atmosphere of a gas mixture of Ar and $N_2$, and the photoabsorption gradient is produced by changing the volume of $N_2$ gas during sputtering.

15. A resist pattern forming method, comprising the steps of:
   forming an anti-reflective film over a substrate;
   forming a resist film over the anti-reflective film;
   exposing a pattern onto the resist film so as to form an exposed resist film; and
   developing the exposed resist film to form a resist pattern;
   wherein the anti-reflective film is formed of a material containing a photoabsorptive compound that can be evaporated from a surface of the anti-reflective film by heat treatment, and wherein the anti-reflective film, after being formed over the substrate, is heat-treated so that an extinction coefficient of the anti-reflective film increases from a side of the anti-reflective film closest to the resist film toward a side closest to the substrate.

16. A resist pattern forming method according to claim 15, wherein the heat treatment is performed so that the extinction coefficient continuously increases from the side of the anti-reflective film closest to the resist film to the side of the anti-reflective film closest to the substrate.

17. A resist pattern forming method according to claim 15, wherein the photoabsorptive compound is an anthracene derivative.

18. A resist pattern forming method, comprising the steps of:

forming an anti-reflective film over a substrate;

forming a resist film over the anti-reflective film;

exposing a pattern onto the resist film using a pattern exposure light, to form an exposed resist film; and developing the exposed resist film to form a resist pattern;

wherein forming the anti-reflective film comprises:

depositing over the substrate a layer of a material which has an ability to absorb the pattern exposure light, whose photoabsorption level for the pattern exposure light lowers when it is irradiated with a photoabsorption modulation light, and which also has an ability to absorb the photoabsorption modulation light; and thereafter, radiating onto an upper surface of the layer the photoabsorption modulation light, so as to form an irradiated layer, so that an extinction coefficient of the irradiated layer for the pattern exposure light is smaller at the upper surface of the irradiated layer than at a deeper part of the irradiated layer.

19. A resist pattern forming method according to claim 18, wherein intensity of the photoabsorption modulation light is uniform over a plane.

20. A resist pattern forming method according to claim 18, wherein the material contains a photoabsorptive compound for the pattern exposure light, and the photoabsorptive compound has a property that its extinction coefficient for the pattern exposure light decreases as it is irradiated with the photoabsorption modulation light.

21. A resist pattern forming method according to claim 20, wherein the photoabsorptive compound is a nitrone compound.

22. A resist pattern forming method, comprising the steps of:

forming an anti-reflective film over a substrate;

forming a resist film over the anti-reflective film;

exposing a pattern onto the resist film, using a pattern exposure light, so as to form an exposed resist film; and developing the exposed resist film to form a resist pattern;

wherein the forming the anti-reflective film comprises:

depositing over the substrate a layer of material which has an ability to absorb the pattern exposure light, whose photoabsorption level for the pattern exposure light lowers when it is irradiated with photoabsorption modulation light, and which also has an ability to absorb the photoabsorption modulation light;

radiating onto an upper surface of the layer the photoabsorption modulation light; and fixing the layer so as to provide the anti-reflective film, by exposing the layer to a gas or liquid so as to form a film whose photoabsorption characteristic does not change even when it is irradiated with the pattern exposure light.

23. A resist pattern forming method according to claim 22, wherein the photoabsorption modulation light radiated onto an upper surface of the layer has an intensity that is uniform over a plane.

24. A resist pattern forming method, comprising the steps of:

forming a film containing a nitrone compound over a substrate;

radiating photoabsorption modulation light onto the film containing the nitrone compound;

putting the film containing the nitrone compound in an atmosphere of HCl gas, to form a treated film;

forming a resist film over the treated film;

exposing a pattern onto the resist film using a pattern exposure light, so as to form an exposed resist film; and developing the exposed resist film.

25. A resist pattern forming method according to claim 24, wherein the film containing the nitrone compound is put in the atmosphere of HCl gas after said radiating the photoabsorption modulation light.

26. A resist pattern forming method, comprising the steps of:

forming over a substrate a film containing a diazonium salt and phenol;

radiating photoabsorption modulation light onto the film;

putting the film in the atmosphere of alkali vapor, so as to form a treated film;

forming a resist film over the treated film;

exposing a pattern onto the resist film using a pattern exposure light, so as to form an exposed resist film; and developing the exposed resist film.

27. A resist pattern forming method according to claim 26, wherein the film containing the diazonium salt and phenol is put in the atmosphere of alkali vapor after said radiating the photoabsorption modulation light.

28. A resist pattern forming method, comprising the steps of:

forming an anti-reflective film over a substrate;

forming a resist film over the anti-reflective film;

exposing a pattern onto the resist film, using a pattern exposure light, so as to form an exposed resist film; and developing the exposed resist film to form a resist pattern;

wherein the anti-reflective film is formed by depositing over the substrate a layer, which has a property of absorbing photoabsorption modulation light together with the pattern exposure light, and also has a property that the ability to absorb the pattern exposure light lowers when heat-treated after being irradiated with the photoabsorption modulation light;

then irradiating the layer from its upper surface with the photoabsorption modulation light; and then heat-treating the layer to produce the anti-reflective film, whose extinction coefficient for the pattern exposure light is smaller at the upper surface of the anti-reflective film than at a deep part of the film.

29. A resist pattern forming method according to claim 28, wherein the layer is irradiated with photoabsorption modulation light whose intensity is uniform in a plane.

30. A resist pattern forming method according to claim 28, wherein the anti-reflective film contains aromatic azide.

31. A resist pattern forming method, comprising the steps of:

forming an anti-reflective film over a substrate, said substrate including a transparent film on a body, the transparent film being transparent to pattern exposure light;

forming a resist film over the anti-reflective film;

exposing a pattern onto the resist film, so as to form an exposed resist film; and developing the exposed resist film to form a resist pattern;

wherein the anti-reflective film is formed on the transparent film, and wherein the anti-reflective film is formed of two layers by successively stacking a first layer and then a second layer, and an extinction coefficient for the first layer for the pattern exposure light is greater than that of the second layer.

32. A resist pattern forming method according to claim 31, wherein the first and second layers are formed by a chemical vapor deposition method, and the extinction coefficients of the first and second layers are changed by changing the film-forming conditions.

33. A resist pattern forming method according to claim 32, wherein the layers formed by the chemical vapor deposition method are each made of $SiO_xN_yH_z$, and the extinction coefficients of the first and second layers are changed by changing the composition of the layers, by changing at least one of x, y and z.

34. A resist pattern forming method according to claim 33, wherein the first and second layers are formed by sputtering, and the extinction coefficients of the first and second layers are changed by changing the composition of the sputtering atmosphere during the sputtering.

35. A resist pattern forming method according to claim 34, wherein the first and second layers are formed by sputtering with silicon as a target in an atmosphere of a gas mixture of Ar and $N_2$, and the extinction coefficients of the first and second layers are changed by changing an amount of $N_2$ gas supplied.

36. A resist pattern forming method according to claim 35, wherein with respect to a KrF excimer laser beam the first layer has a refractive index $n_1$ (real part) of 2.3 and the extinction coefficient $k_1$ (imaginary part of refractive index) of 2.8, and the second layer has a refractive index $n_2$ (real part) of 2.3 and the extinction coefficient $k_2$ (imaginary part of refractive index) of 0.6.

37. A resist pattern forming method according to claim 31, wherein the extinction coefficient (imaginary part of refractive index) of the first layer, for an exposure light for exposing a pattern onto the resist film, is 2 or greater.

38. A resist pattern forming method according to claim 35, wherein with respect to i line radiation (wavelength 365 nm) the first layer has a refractive index $n_1$ (real part) of 4.6 and the extinction coefficient $k_1$ (imaginary part of refractive index) of 2.7, and the second layer has a refractive index $n_2$ (real part) of 2.8 and the extinction coefficient $k_2$ (imaginary part of refractive index) of 0.4.

39. A resist pattern forming method, comprising the steps of:

forming over a substrate a first film that constitutes an anti-reflective film;

forming a resist film over the first film;

exposing a pattern onto the resist film using a pattern exposure light, so as to form an exposed resist film; and developing the exposed resist film to form a resist pattern;

wherein the first film constituting the anti-reflective film is formed of a plurality of layers, a lowermost layer of the first film is a film that reflects the pattern exposure light, and a second layer on the lowermost layer is an interference anti-reflection film for the pattern exposure light.

40. A resist pattern forming method according to claim 39, wherein the lowermost layer is a metal film.

41. A resist pattern forming method according to claim 39, wherein the lowermost layer is formed of a material selected from the group consisting of Al, W, Ti, Si and Pt.

42. A resist pattern forming method according to claim 39, wherein the interference anti-reflection film has a smaller extinction coefficient for the exposure light than that of the lowermost layer.

43. A resist pattern forming method according to claim 42, wherein the lowermost layer and the interference anti-reflection film are $SiO_xN_yH_z$ films formed by a CVD method, and extinction coefficients of these films are changed by changing their composition by changing at least one of x, y and z.

44. A resist pattern forming method according to claim 39, wherein the interference anti-reflection film is a film formed by sputtering, and the extinction coefficient of the interference antireflection film for the pattern exposure light is made smaller than that of the lowermost layer by changing a composition of the gas atmosphere during sputtering.

45. A resist pattern forming method according to claim 44, wherein the sputtering is performed with Si as a target in an atmosphere of a gas mixture of inert gas and $N_2$, and an extinction coefficient of the first film is changed by changing amount of $N_2$ gas supplied.

46. A resist pattern forming method according to claim 39, wherein an uppermost film making up the substrate is transparent to the pattern exposure light.

47. A resist pattern forming method according to claim 39, wherein the substrate has an uneven surface.

48. A resist pattern forming method, comprising the steps of:

forming over a substrate a first film that constitutes an anti-reflective film, said substrate including a transparent film on a body, the transparent film being transparent to pattern exposure light;

forming a resist film over the first film;

exposing a desired pattern onto the resist film through use of the pattern exposure light, so as to form an exposed resist film; and developing the exposed resist film to form a resist pattern;

wherein the first film is formed over the transparent film, and wherein the first film constituting the anti-reflective film is a two-layer film of a second layer stacked on a first layer, the first layer absorbing more pattern exposure light than does the second layer, and the second layer being an interference anti-reflection film for the pattern exposure light.

49. A resist pattern forming method, comprising the steps of:

forming over a substrate a first film that constitutes an anti-reflective film;

forming a resist film over the first film;

exposing a pattern onto the resist film using a pattern exposure light, so as to form an exposed resist film; and developing the exposed resist film to form a resist pattern;

wherein the first film constituting the anti-reflective film is a two-layer film formed by successively stacking a first layer and a second layer, the first layer is a layer that reflects the pattern exposure light and the second layer is an interference anti-reflection layer.

50. A resist pattern forming method according to claim 49, wherein the first layer is a metal film.

51. A resist pattern forming method according to claim 49, wherein the first layer is formed of a material selected from the group consisting of Al, W, Ti, Si and Pt.

52. A resist pattern forming method according to claim 49, wherein refractive index and extinction coefficient of the first layer are about 2.3 and 2.8, and those of the second layer are about 2.3 and 0.6, respectively.

53. A resist pattern forming method according to claim 52, wherein a thickness of the second layer is in a range between 0.017 µm and 0.039 µm.

54. A resist pattern forming method according to claim 49, wherein refractive index and extinction coefficient of the first layer are about 2.2 and 1.8, respectively, and those of the second layer are about 2.1 and 0.7, respectively.

55. A resist pattern forming method according to claim 49, wherein the first layer is an aluminum film, and refractive index and extinction coefficient of the second layer are about 2.48 and 0.9, respectively.

56. A resist pattern forming method according to claim 49, wherein the first layer is an aluminum film, and refractive index and extinction coefficient of the second layer are about 2.13 and 0.8, respectively.

57. A resist pattern forming method according to claim 56, wherein refractive index and extinction coefficient of the aluminum film are about 0.19 and 2.94, respectively.

58. A resist pattern forming method according to claim 55, wherein refractive index and extinction coefficient of the aluminum film are about 0.19 and 2.94, respectively.

59. A resist pattern forming method according to claim 56, wherein a thickness of the aluminum film is at least 0.04 µm.

60. A resist pattern forming method according to claim 49, wherein the first layer is a tungsten film, and refractive index and extinction coefficient of the second layer are about 2.3 and 0.6, respectively.

61. A resist pattern forming method according to claim 49, wherein the first layer is a tungsten film, and refractive index and extinction coefficient of the second layer are about 2.08 and 0.6, respectively.

62. A resist pattern forming method according to claim 61, wherein refractive index and extinction coefficient of the tungsten film are about 3.4 and 2.85, respectively.

63. A resist pattern forming method according to claim 61, wherein a thickness of the tungsten film is at least 0.02 µm.

64. A resist pattern forming method according to claim 60, wherein refractive index and extinction coefficient of the tungsten film are about 3.4 and 2.85, respectively.

65. A resist pattern forming method according to claim 60, wherein a thickness of the tungsten film is at least 0.02 µm.

66. A resist pattern forming method according to claim 49, wherein an uppermost film making up the substrate is transparent to the pattern exposure light.

67. A resist pattern forming method according to claim 49, wherein the interference anti-reflection layer absorbs the pattern exposure light.

68. A resist pattern forming method according to claim 49, wherein the substrate has steps, and wherein the first film and the resist film are provided over the steps and over other portions of the substrate.

69. A resist pattern forming method, comprising the steps of:
applying a resist to a substrate;
exposing a pattern onto the resist, so as to form an exposed resist; and
developing the exposed resist to form a desired resist pattern;
wherein the resist is a chemically amplified resist using acid catalyst reaction, and a sputtered film containing silicon is formed over the substrate.

70. A resist pattern forming method according to claim 69, wherein the sputtered film is formed prior to applying the resist to the substrate, such that the sputtered film is formed between the substrate and the resist film.

71. A resist pattern forming method, comprising the steps of:
forming an anti-reflective film over a substrate;
forming a resist film over the anti-reflective film;
exposing a pattern onto the resist film, so as to form an exposed resist film, a surface part of the anti-reflective film also being exposed to light during the exposing; and
developing the exposed resist film to form a resist pattern;
wherein the anti-reflective film is made of a material whose extinction coefficient for of exposure light, for forming the exposed resist film, becomes small as it is exposed to light during the exposing.

72. A method of etching an object film, which processes the object film including at least one layer of metal film or metal-containing film into a first geometry, comprising the steps of:
forming over the object film a same metal film or metal-containing film as that included in the object film;
forming a second film over said same metal film or metal-containing film;
forming a resist film over the second film;
exposing a pattern onto the resist film, using a pattern exposure light;
developing the resist film, so as to form a developed resist film;
with the developed resist film as a mask, etching the second film and said same metal film or metal-containing film;
etching the object film until the metal film or metal-containing film in the object film is exposed;
removing the resist; and
after removing the resist, further etching the object film;
wherein the second film is an interference film for the pattern exposure light.

73. A method of etching an object film according to claim 72, wherein, in said further etching the object film, said same metal film or metal-containing film is also etched.

74. A method of etching an object film according to claim 72, wherein the same metal film or metal-containing film is made of a material selected from the group consisting of Al, W, Ti, Ta, Pt, tungsten silicide, and titanium silicide.

75. A method of etching an object film according to claim 72, wherein the second film is an $SiN_x$ film or $SiO_xN_yH_z$ film.

76. A method of etching an object film according to claim 72, wherein said object film has an uneven surface.

77. A method of etching an object film according to claim 72, wherein said object film has a stepped surface, and the second film and resist film are formed over the stepped surface.

78. A method of etching a substrate, comprising the steps of:
providing an anti-reflective film over a substrate to be etched, said substrate including a conductive layer, the conductive layer being provided on an insulating film;
forming a resist film overlying the anti-reflective film;
exposing a pattern onto the resist film, so as to form an exposed resist film;
developing the exposed resist film, so as to form a resist pattern;
etching the anti-reflective film using the resist pattern as a mask;

removing the resist pattern; and after removing the resist pattern, etching the substrate with an etchant, both the anti-reflective film and the substrate being etched by said etchant.

79. A method of etching a substrate according to claim 78, wherein the anti-reflective film is a silicon nitride film, and the substrate is at least one film of a material selected from the group consisting of polysilicon, a silicide and a polycide.

80. A method of etching a substrate according to claim 78, wherein the anti-reflective film has an extinction coefficient for exposure light for exposing the resist film, that is not uniform in a thickness direction of the anti-reflective film.

81. A method of etching a substrate according to claim 78, wherein the anti-reflective film is made of a material having a substantially same etching rate in said etchant as that of material of said substrate.

82. A method of etching a substrate according to claim 78, wherein the anti-reflective film has an extinction coefficient for exposure light, for exposing the pattern onto the resist film, that is not uniform in a direction of thickness of the anti-reflective film.

83. A method of etching a substrate according to claim 82, wherein the extinction coefficient of the anti-reflective film is greater at a side closest to the substrate than at a side closest to the resist film.

84. A method of etching a substrate according to claim 78, wherein the anti-reflective film is a two-layer film of a first layer closest to the substrate and a second layer on the first layer, the first layer being a layer that reflects pattern exposure light used for the exposing, and the second layer being an interference anti-reflection layer.

85. A method of etching a substrate according to claim 84, wherein the interference anti-reflection layer absorbs the pattern exposure light.

86. A method of etching a substrate according to claim 78, wherein the anti-reflective film is a two-layer film of a first layer closest to the substrate and a second layer on the first layer, the second layer being an interference anti-reflective layer, and the first layer having a greater extinction coefficient for pattern exposure light, used for said exposing, than that of the second layer.

87. A method of manufacturing a semiconductor device, comprising the steps of:

forming a conductive film overlying an insulating film on a semiconductor substrate;

forming an anti-reflective film over said conductive film;

forming a resist film over the anti-reflective film;

exposing the resist film to exposure light in a pattern, so as to form an exposed resist film, the pattern being a pattern for a component of a semiconductor device; and developing the exposed resist film, wherein the anti-reflective film is a two-layer film of a first layer closest to the substrate and a second layer on the first layer, the first layer being a layer that reflects the exposure light and the second layer being an interference anti-reflection layer.

88. A method of manufacturing a semiconductor device according to claim 87, wherein the pattern is a pattern for forming word lines of the semiconductor device.

89. A method of manufacturing a semiconductor device according to claim 87, wherein the conductive film has an uneven surface.

90. A method of manufacturing a semiconductor device according to claim 87, wherein the conductive film has stepped portions, the anti-reflective film and resist film overlying the stepped portions.

91. A method of manufacturing a semiconductor device according to claim 87, including a further step, after developing the resist film, so as to provide a developed resist film, of using the developed resist film as a mask in selectively removing the anti-reflective film, leaving an anti-reflective film portion, the anti-reflective film portion being used as a mask in selectively removing the conductive film.

92. A method of manufacturing a semiconductor device according to claim 91, wherein the conductive film is selectively removed by etching, using an etchant; wherein the developed resist film is removed prior to etching the conductive film, and wherein material of the anti-reflective film is etched by said etchant, whereby during selective removal of the conductive film by etching the anti-reflective film portion is also removed.

93. A method of manufacturing a semiconductor device according to claim 87, wherein the anti-reflective film has an extinction coefficient for exposure light, for exposing the pattern onto the resist film, that is not uniform in a direction of thickness of the anti-reflective film.

94. A method of manufacturing a semiconductor device according to claim 93, wherein the extinction coefficient of the anti-reflective film is greater at a side closest to the substrate than at a side closest to the resist film.

95. A method of manufacturing a semiconductor device according to claim 87, wherein the anti-reflective film is a two-layer film of a first layer closest to the substrate and a second layer on the first layer, the first layer being a layer that reflects pattern exposure light used for the exposing, and the second layer being an interference anti-reflection layer.

96. A method of manufacturing a semiconductor device according to claim 95, wherein the interference anti-reflection layer absorbs the pattern exposure light.

97. A method of manufacturing a semiconductor device according to claim 87, wherein the anti-reflective film is a two-layer film of a first layer closest to the substrate and a second layer on the first layer, the second layer being an interference anti-reflective layer, and the first layer having a greater extinction coefficient for pattern exposure light, used for said exposing, than that of the second layer.

98. An interconnect forming method, comprising the steps of:

forming a silicon oxide film over a conductive film;

depositing silicon over the silicon oxide film to a thickness of at least 0.025 μm by sputtering, to form a silicon film;

depositing an SiNx film over the silicon film by sputtering;

applying a resist over the SiNx film;

exposing and developing the resist to form a resist pattern;

etching the SiNx, silicon and silicon oxide films with the resist pattern used as a mask, thereby forming a silicon oxide film pattern;

removing the resist pattern; and etching the conductive film with the silicon oxide film pattern as a mask.

99. An interconnect forming method according to claim 98, wherein the conductive film is selected from the group consisting of a polysilicon film, a tungsten silicide film and a tungsten polycide film.

100. An anti-reflective film used for lithography and formed between a substrate and a resist film to absorb pattern exposure light, the anti-reflective film having an extinction coefficient for the exposure light which is greater on a side closest to the substrate than on a side closest to the resist film.

101. An anti-reflective film used for lithography according to claim 100, wherein the extinction coefficient of the anti-reflective film continuously increases from the side closest to the resist film toward the side closest to the substrate.

102. An anti-reflective film used for lithography, formed between a substrate and a resist to absorb pattern exposure light, the anti-reflective film being made of a material having an extinction coefficient for the pattern exposure light which becomes small as it is exposed to the pattern exposure light.

103. Product formed by the method of claim 5.

104. Product formed by the method of claim 39.

105. Product formed by the method of claim 48.

106. A resist pattern forming method, comprising the steps of:

forming an anti-reflective film over a substrate;

forming a resist film over the anti-reflective film;

exposing a pattern onto the resist film, so as to form an exposed resist film; and developing the exposed resist film to form a resist pattern;

wherein the anti-reflective film is formed of two layers by successively stacking a first layer and then a second layer, and an extinction coefficient of the first layer for the pattern exposure light is not smaller than 1.8 and an extinction coefficient of the second layer for the pattern exposure light is not greater than 0.9.

107. A resist pattern forming method, comprising the steps of:

forming over a substrate a first film that constitutes an anti-reflective film;

forming a resist film over the anti-reflective film;

exposing a desired pattern onto the resist film through use of a pattern exposure light, so as to form an exposed resist film; and developing the exposed resist film to form a resist pattern;

wherein the first film constituting the anti-reflective film is a two-layer film of a second layer stacked on a first layer, and an extinction coefficient of the first layer for the pattern exposure light is not smaller than 1.8 and an extinction coefficient of the second layer for the pattern exposure light is not greater than 0.9, the second layer being an interference anti-reflection film for the pattern exposure light.

108. A method of manufacturing a semiconductor device, comprising the steps of:

forming a conductive film overlying an insulating film on a semiconductor substrate;

forming an anti-reflective film over said conductive film;

forming a resist film over the anti-reflective film;

exposing the resist film to exposure light in a pattern, so as to form an exposed resist film, the pattern being a pattern for a component of the semiconductor device; and developing the exposed resist film, wherein the anti-reflective film has an extinction coefficient for the exposure light that is not uniform in a direction of anti-reflective film thickness.

109. A method of manufacturing a semiconductor device, comprising the steps of:

forming a conductive film overlying an insulating film on a semiconductor substrate;

forming an anti-reflective film over said conductive film;

forming a resist film over the anti-reflective film;

exposing the resist film to exposure light in a pattern, so as to form an exposed resist film, the pattern being a pattern for a component of a semiconductor device; and developing the exposed resist film, wherein the anti-reflective film is a two-layer film of a first layer closest to the substrate and a second layer on the first layer, the second layer being an interference anti-reflection layer and the first layer having a greater extinction coefficient for the pattern exposure light than that of the second layer.

* * * * *